United States Patent
Chen

(10) Patent No.: US 8,737,081 B2
(45) Date of Patent: May 27, 2014

(54) COVER STRUCTURE AND MANUFACTURING METHOD THEREOF

(75) Inventor: Chien-Ming Chen, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 224 days.

(21) Appl. No.: 13/196,915

(22) Filed: Aug. 3, 2011

(65) Prior Publication Data

US 2012/0285719 A1 Nov. 15, 2012

(30) Foreign Application Priority Data

May 12, 2011 (TW) .............................. 100116692 A

(51) Int. Cl.
*H05K 1/00* (2006.01)

(52) U.S. Cl.
USPC .............. 361/748; 361/760; 361/761; 174/64

(58) Field of Classification Search
USPC ................ 361/748, 760, 761; 174/64
See application file for complete search history.

(56) References Cited

U.S. PATENT DOCUMENTS

| 8,101,868 B2* | 1/2012 | Ito et al. ........................ 174/260 |
| 2004/0232536 A1* | 11/2004 | Fukuzumi ...................... 257/684 |

* cited by examiner

*Primary Examiner* — Timothy Thompson
*Assistant Examiner* — Andargie M Aychillhum
(74) *Attorney, Agent, or Firm* — Jianq Chyun IP Office

(57) ABSTRACT

A method of manufacturing a cover structure is provided. A first insulating layer is provided. The first insulating layer has a first surface and a second surface opposite to each other. A second insulating layer is provided. The second insulating layer has a third surface and a fourth surface opposite to each other and an opening passing through the third surface and the fourth surface. A thickness of the second insulating layer is greater than a thickness of the first insulating layer. The first insulating layer and the second insulating layer are laminated to each other, so that the third surface of the second insulating layer connects to the second surface of the first insulating layer. A cavity is defined by the opening of the second insulating layer and the first insulating layer. A metal layer is formed on the cavity.

6 Claims, 24 Drawing Sheets

COVER STRUCTURE AND MANUFACTURING METHOD THEREOF

CROSS-REFERENCE TO RELATED APPLICATION

This application claims the priority benefit of Taiwan application serial no. 100116692, filed May 12, 2011. The entirety of the above-mentioned patent application is hereby incorporated by reference herein and made a part of this specification.

BACKGROUND OF THE INVENTION

1. Field of the Invention

The invention relates to a cover structure and more particularly to a cover structure capable of preventing electro-magnetic interference and a manufacturing method thereof.

2. Description of Related Art

An integrated circuit chip (IC chip) is usually electrically connected to a motherboard through a circuit board for electronic signals to be transmitted between the IC chip and the motherboard. However, the electronic signals are more easily affected by electro-magnetic interference (EMI) when the IC chip has a higher clock frequency. Since EMI often interrupts, blocks, lowers, or limits the performance of the electronic device or the overall circuit system, an effective EMI shielding is required to ensure the efficiency and safety of the electronic device or the system. To prevent EMI from interrupting the stability of the IC chip, a metal cover is usually mounted above the circuit board to avoid the interference caused by the leakage of electro-magnetic waves or the inleakage of external electro-magnetic waves.

SUMMARY OF THE INVENTION

The invention is directed to a cover structure capable of preventing electro-magnetic interference (EMI).

The invention is further directed to a manufacturing method of a cover structure. By applying the manufacturing method, the aforesaid cover structure can be formed.

The invention is directed to a method of manufacturing a cover structure. The method includes the following. A first insulating layer is provided. The first insulating layer has a first surface and a second surface opposite to each other. A second insulating layer is provided. The second insulating layer has a third surface and a fourth surface opposite to each other and an opening passing through the third surface and the fourth surface. A thickness of the second insulating layer is greater than a thickness of the first insulating layer. The first insulating layer and the second insulating layer are laminated to connect the third surface of the second insulating layer to the second surface of the first insulating layer. Here, a cavity is defined by the opening of the second insulating layer and the first insulating layer. A metal layer is formed on the cavity.

In one embodiment of the invention, the method of manufacturing the cover structure further includes: forming the metal layer on the fourth surface of the second insulating layer while forming the metal layer on the cavity; and patterning a portion of the metal layer formed on the fourth surface of the second insulating layer to form a patterned circuit layer.

In one embodiment of the invention, the second insulating layer is an adhesive film.

In one embodiment of the invention, the method of manufacturing the cover structure further includes: forming an adhesive layer between the first insulating layer and the second insulating layer before laminating the first insulating layer and the second insulating layer; and laminating the first insulating layer and the second insulating layer to join the first insulating layer and the second insulating layer through the adhesive layer.

In one embodiment of the invention, the method of manufacturing the cover structure further includes: forming a copper foil layer on the fourth surface of the second insulating layer after forming the second insulating layer; forming an adhesive layer between the first insulating layer and the second insulating layer before laminating the first insulating layer and the second insulating layer; laminating the first insulating layer and the second insulating layer to join the first insulating layer and the second insulating layer through the adhesive layer; connecting the metal layer to the copper foil layer after forming the metal layer on the cavity; and patterning the copper foil layer to form a patterned circuit layer.

In one embodiment of the invention, the method of manufacturing the cover structure further includes: forming a first copper foil layer and a second copper foil layer on the first surface and the second surface of the first insulating layer respectively after forming the first insulating layer; forming a third copper foil layer and a fourth copper foil layer on the third surface and the fourth surface of the second insulating layer respectively after forming the second insulating layer; forming an adhesive layer between the second copper foil layer and the third copper foil layer before laminating the first insulating layer and the second insulating layer; laminating the first insulating layer and the second insulating layer to join the second copper foil layer and the third copper foil layer through the adhesive layer; connecting the metal layer to the fourth copper foil layer after forming the metal layer on the cavity; and patterning the first copper foil layer and the fourth copper foil layer to form a first patterned circuit layer and a fourth patterned circuit layer.

In one embodiment of the invention, the method of manufacturing the cover structure further includes: patterning the second copper foil layer and the third copper foil layer before forming the adhesive layer to form a second patterned circuit layer and a third patterned circuit layer; forming the adhesive layer between the second patterned circuit layer and the third patterned circuit layer; and laminating the first insulating layer and the second insulating layer to join the second patterned circuit layer and the third patterned circuit layer through the adhesive layer.

In one embodiment of the invention, the method of manufacturing the cover structure further includes: forming at least one via passing through the first copper foil layer, the first insulating layer, the second patterned circuit layer, the adhesive layer, the third patterned circuit layer, the second insulating layer, and the fourth copper foil layer after laminating the first insulating layer and the second insulating layer; forming the metal layer on an inner wall of the via while forming the metal layer on the cavity; and filling a conductive material in the via before patterning the first copper foil layer and the fourth copper foil layer.

The invention is directed to a cover structure suitable for covering a circuit board bearing at least one electronic device. The cover structure includes a first insulating layer, a second insulating layer, a metal layer, and a patterned circuit layer. The first insulating layer has a first surface and a second surface opposite to each other. The second insulating layer has a third surface and a fourth surface opposite to each other and an opening passing through the third surface and the fourth surface. The third surface of the second insulating layer connects to the second surface of the first insulating layer. A cavity is defined by the opening of the second insulating layer and the first insulating layer. A thickness of the second insulating layer is greater than a thickness of the first insulating layer. The metal layer is disposed on the cavity. The patterned circuit layer is disposed on the fourth surface of the second insulating layer and connects to the metal layer. The circuit board is electrically connected to the patterned circuit layer and the electronic device is sandwiched between the circuit board and the metal layer.

In one embodiment of the invention, the second insulating layer is an adhesive film.

In one embodiment of the invention, the cover structure further includes an adhesive layer sandwiched between the first insulating layer and the second insulating layer.

In one embodiment of the invention, the cover structure further includes a first patterned circuit layer, a second copper foil layer, and a third copper foil layer. The first patterned circuit layer is disposed on the first surface of the first insulating layer and exposes a portion of the first surface. The second copper foil layer is disposed on the second surface of the first insulating layer and covers the second surface entirely. The third copper foil layer is disposed on the third surface of the second insulating layer and covers the third surface entirely.

In one embodiment of the invention, the cover structure further includes a first patterned circuit layer, a second patterned circuit layer, and a third patterned circuit layer. The first patterned circuit layer is disposed on the first surface of the first insulating layer and exposes a portion of the first surface. The second patterned circuit layer is disposed on the second surface of the first insulating layer and exposes a portion of the second surface. The third patterned circuit layer is disposed on the third surface of the second insulating layer and exposes a portion of the third surface.

In one embodiment of the invention, the cover structure further includes at least one conductive hole structure passing through the first patterned circuit layer, the first insulating layer, the second patterned circuit layer, the adhesive layer, the third patterned circuit layer, the second insulating layer, and the fourth patterned circuit layer. Two ends of the conductive hole structure connect to the first patterned circuit layer and the fourth patterned circuit layer respectively.

In light of the foregoing, the cover structure of the invention has a cavity and a metal layer is disposed on the cavity. When the cover structure is positioned on the circuit board, the electronic device on the circuit board can be disposed in the cavity. The metal layer then acts as an electro-magnetic wave shielding layer to reduce EMI from the external environment and prevent the electronic device on the circuit board from being interfered by external signals.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

Figure 1A:
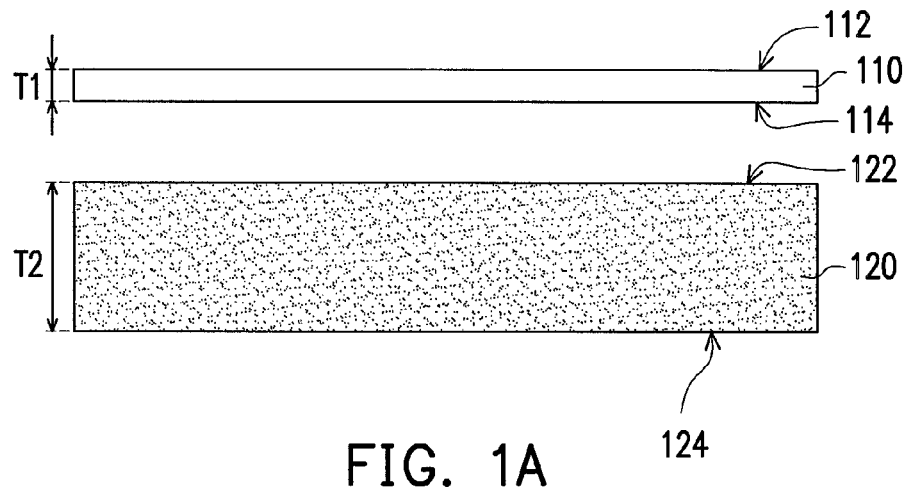
FIGS. 1A to 1E are schematic cross-sectional diagrams illustrating a method of manufacturing a cover structure according to an embodiment of the invention.

FIGS. 1A to 1E are schematic cross-sectional diagrams illustrating a method of manufacturing a cover structure according to an embodiment of the invention. Referring to FIG. 1A, according to the method of manufacturing the cover structure of the present embodiment, firstly, a first insulating layer 110 and a second insulating layer 120 are provided. The first insulating layer 110 has a first surface 112 and a second surface 114 opposite to each other. The second insulating layer 120 has a third surface 122 and a fourth surface 124 opposite to each other. Particularly, in the present embodiment, a thickness T2 of the second insulating layer 120 is greater than a thickness T1 of the first insulating layer 110. The second insulating layer 120 is substantially an adhesive film.

Figure 1B:
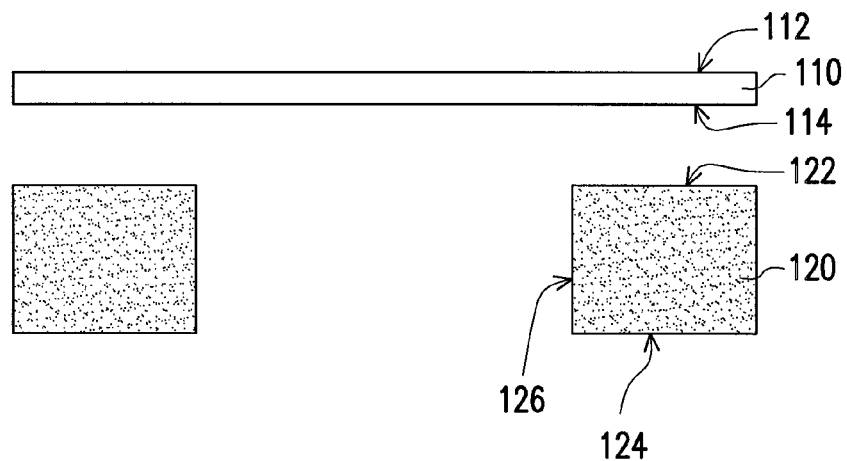

Next, referring to FIG. 1B, an opening 126 passing through the third surface 122 and the fourth surface 124 of the second insulating layer 120 is formed. A method of forming the opening 126 includes punching, routing, mechanical drilling, laser drilling, or other suitable methods.

Figure 1C:
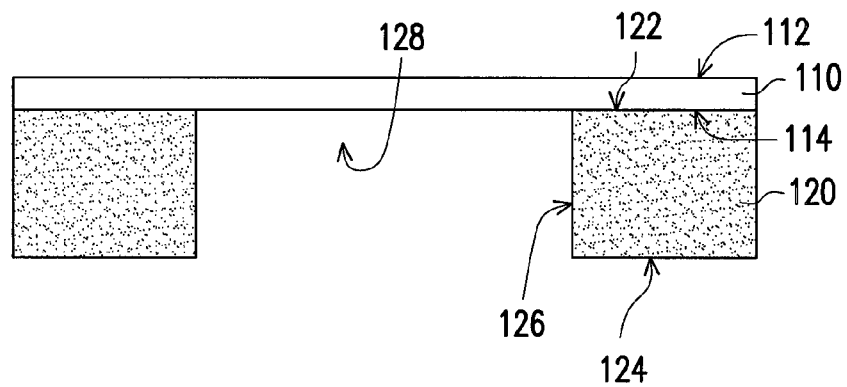

Referring to FIG. 1C, the first insulating layer 110 and the second insulating layer 120 are laminated to connect the third surface 122 of the second insulating layer 120 to the second surface 114 of the first insulating layer 110. In the present embodiment, since the second insulating layer 120 is substantially an adhesive film, the first insulating layer 110 adheres to the second insulating layer 120 when the first insulating layer 110 and the second insulating layer 120 are laminated through a thermal compression process. At this time, the opening 126 of the second insulating layer 120 and the first insulating layer 110 define a cavity 128 which exposes a portion of the second surface 114 of the first insulating layer 110.

Figure 1D:
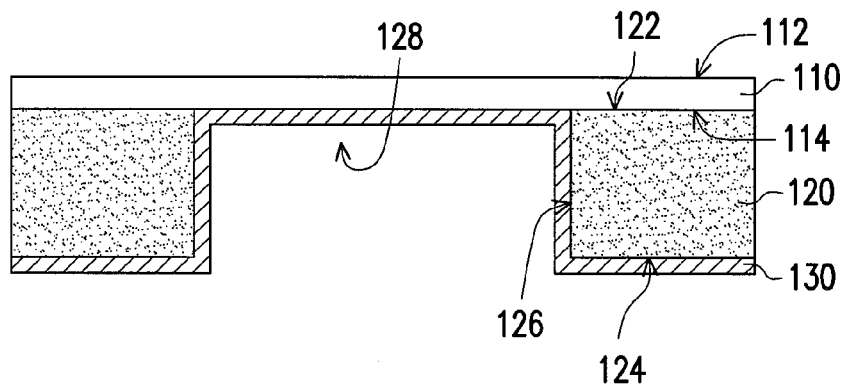

Referring to FIG. 1D, a metal layer 130 is formed on the fourth surface 124 of the second insulating layer 120 and the cavity 128. The metal layer 130 covers the fourth surface 124 of the second insulating layer 120 and an inner wall of the cavity 128. In the present embodiment, a method of forming the metal layer 130 includes an electroplating process.

Figure 1E:
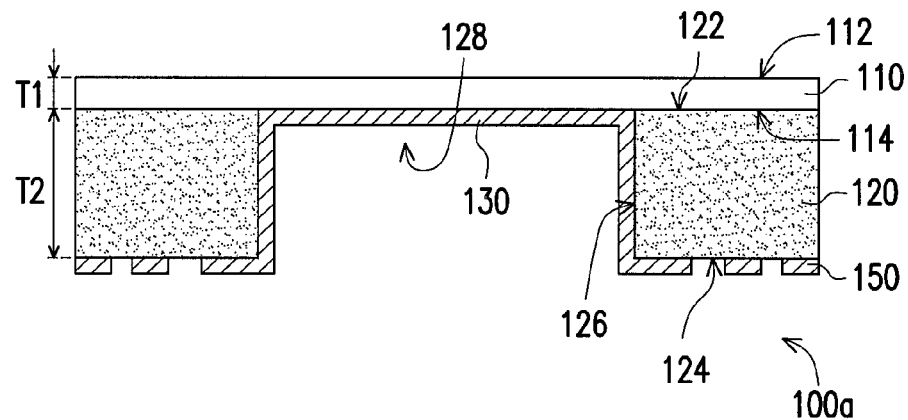

Finally, referring to FIG. 1E, a portion of the metal layer 130 formed on the fourth surface 124 of the second insulating layer 120 is patterned to form a patterned circuit layer 150 exposing a portion of the fourth surface 124 of the second insulating layer 120. Up to this point, the method of manufacturing a cover structure 100a is completed.

In terms of structure, referring to FIG. 1E, the cover structure 100a of the present embodiment includes the first insulating layer 110, the second insulating layer 120, the metal layer 130, and the patterned circuit layer 150. The first insulating layer 110 has the first surface 112 and the second surface 114 opposite to each other. The second insulating layer 120 has the third surface 122 and the fourth surface 124 opposite to each other and the opening 126 passing through the third surface 122 and the fourth surface 124. The third surface 122 of the second insulating layer 120 connects to the second surface 114 of the first insulating layer 110. The cavity 128 is defined by the opening 126 of the second insulating layer 120 and the first insulating layer 110. The thickness T2 of the second insulating layer 120 is greater than the thickness T1 of the first insulating layer 110. The metal layer 130 is disposed on the cavity 128 and covers the inner wall of the cavity 128. The patterned circuit layer 150 is disposed on the fourth surface 124 of the second insulating layer 120 and connects to the metal layer 130.

Figure 1F:
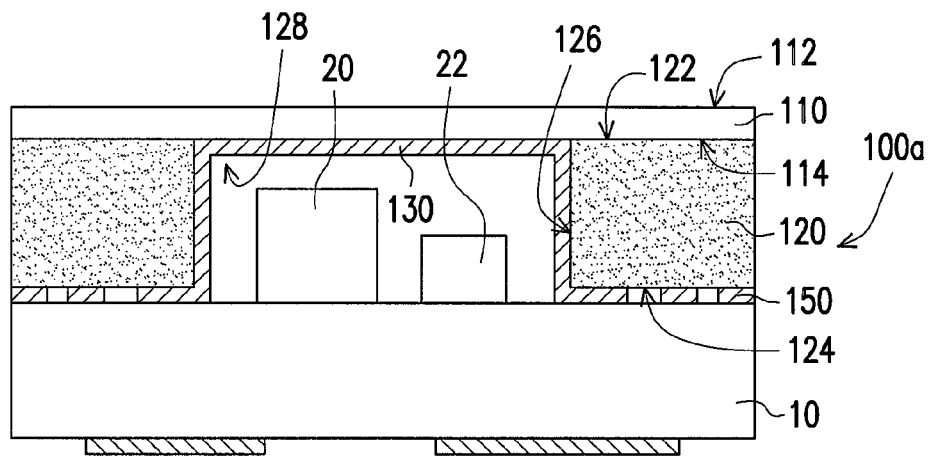
FIG. 1F is a schematic cross-sectional diagram of a cover structure in FIG. 1E disposed on a circuit board bearing at least one electronic device.

FIG. 1F is a schematic cross-sectional diagram of the cover structure in FIG. 1E disposed on a circuit board bearing at least one electronic device. Referring to FIG. 1F, in the present embodiment, the cover structure 100a is suitable for covering a circuit board 10 bearing at least one electronic device (two electronic devices 20, 22 are schematically illustrated in FIG. 1F). The cover structure 100a is positioned on the circuit board 10 to dispose the electronic devices 20, 22 in the cavity 128. Specifically, the electronic devices 20, 22 are disposed in a space formed by the circuit board 10 and the cover structure 100a. Moreover, the metal layer 130 surrounds the electronic devices 20, 22 as an electro-magnetic interference (EMI) shielding layer to reduce external EMI effectively and prevent the electronic devices 20, 22 on the circuit board 10 from being interfered by external signals. Here, the electronic device 20 is, for example, a micro-electro-mechanical device and the electronic device 22 is, for example, an integrated circuit (IC) chip; however, the invention is not limited thereto. In addition, since the cover structure 100a of the present embodiment has the patterned circuit layer 150, the cover structure 100a can be electrically connected to an external circuit (e.g. the circuit board 10) through the patterned circuit layer 150 to expand the application scope of the cover structure 100a.

Several different embodiments are provided below to further illustrate a plurality of cover structures 100b, 100c, 100d, 100e, 100f, 100g, 100h, 100i, 100j, 100k, 100m, and a plurality of manufacturing methods thereof. It should be noted that, the following embodiments adopt notations and partial contents of the exemplary embodiments aforementioned. Herein, identical notations are used to denote identical or similar elements and the descriptions of identical technology are omitted. The omitted parts can be referred to the above embodiment and are not reiterated hereinafter.

Figure 2A:
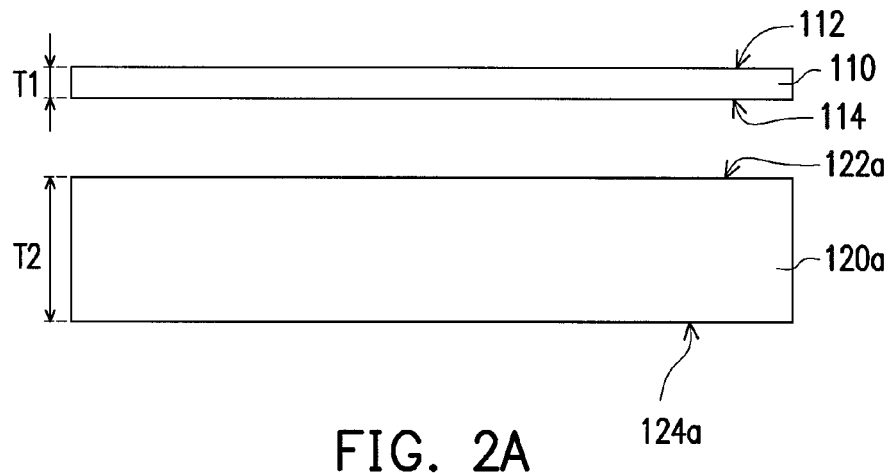
FIGS. 2A to 2E are schematic cross-sectional diagrams illustrating a method of manufacturing a cover structure according to another embodiment of the invention.

FIGS. 2A to 2E are schematic cross-sectional diagrams illustrating a method of manufacturing a cover structure according to another embodiment of the invention. Referring to FIG. 2A, a first insulating layer 110 and a second insulating layer 120a are provided. The first insulating layer 110 has a first surface 112 and a second surface 114 opposite to each other. The second insulating layer 120a has a third surface 122a and a fourth surface 124a opposite to each other. In the present embodiment, a thickness T2 of the second insulating layer 120a is greater than a thickness T1 of the first insulating layer 110. A material of the first insulating layer 110 is substantially identical to that of the second insulating layer 120a, where the material is, for example, epoxy resin or bismaleimide triazine resin (BT resin in short).

Figure 2B:
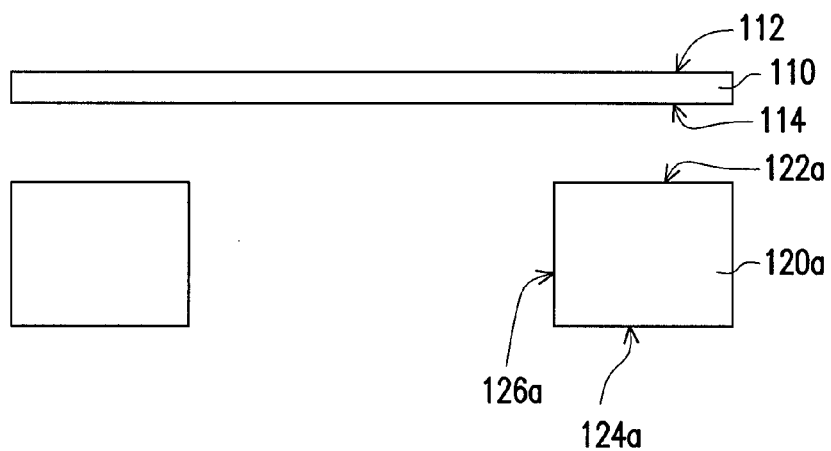

Next, referring to FIG. 2B, an opening 126a passing through the third surface 122a and the fourth surface 124a of the second insulating layer 120a is formed. A method of forming the opening 126a includes punching, routing, mechanical drilling, laser drilling, or other suitable methods.

Figure 2C:
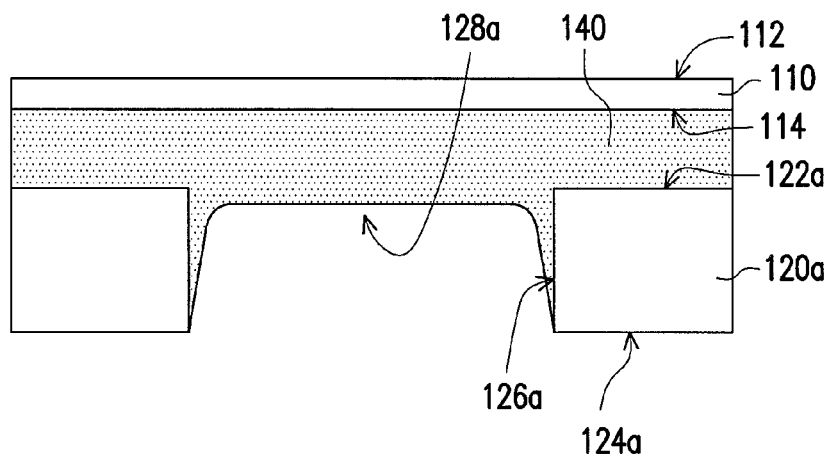

Referring to FIG. 2C, an adhesive layer 140 is formed between the first insulating layer 110 and the second insulating layer 120a. The first insulating layer 110 and the second insulating layer 120a are laminated for the third surface 122a of the second insulating layer 120a to adhere to the second surface 114 of the first insulating layer 110 through the adhesive layer 140. That is, the first insulating layer 110 and the second insulating layer 120a are joined through the adhesive layer 140. At this time, a cavity 128a is defined by the opening 126a of the second insulating layer 120a and the adhesive layer 140 sandwiched between the first insulating layer 110 and the second insulating layer 120a. In the present embodiment, a material of the adhesive layer includes epoxy resin, BT resin, polyimide resin, or a polymer material. A method of laminating the first insulating layer 110 and the second insulating layer 120a is, for instance, a thermal compression process. Since the first insulating layer 110 and the second insulating layer 120 are laminated through the thermal compression process in the present embodiment, a portion of the adhesive layer 140 then extends to an inner wall of the opening 126a as shown in FIG. 2C.

Figure 2D:
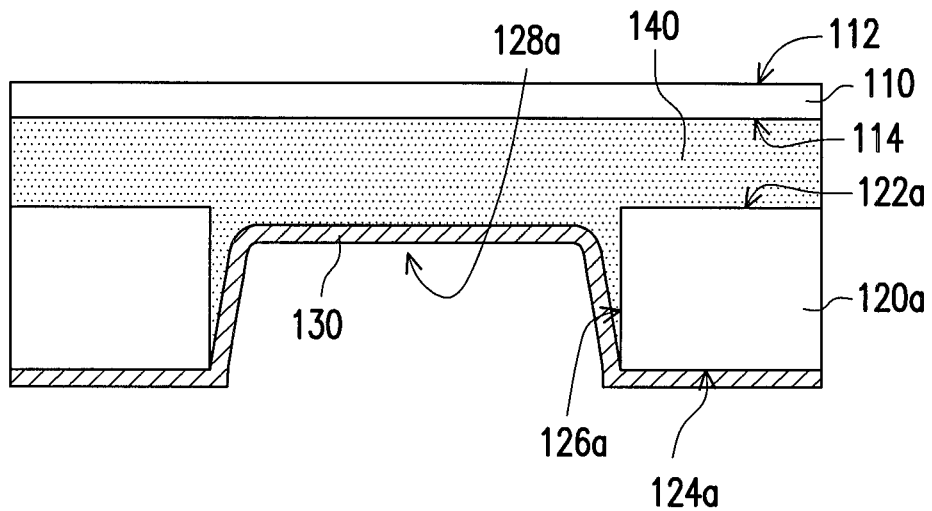

Referring to FIG. 2D, a metal layer 130 is formed on the fourth surface 124a of the second insulating layer 120a and the cavity 128a. The metal layer 130 covers the fourth surface 124a of the second insulating layer 120a and an inner wall of the cavity 128a. In the present embodiment, a method of forming the metal layer 130 includes an electroplating process.

Figure 2E:
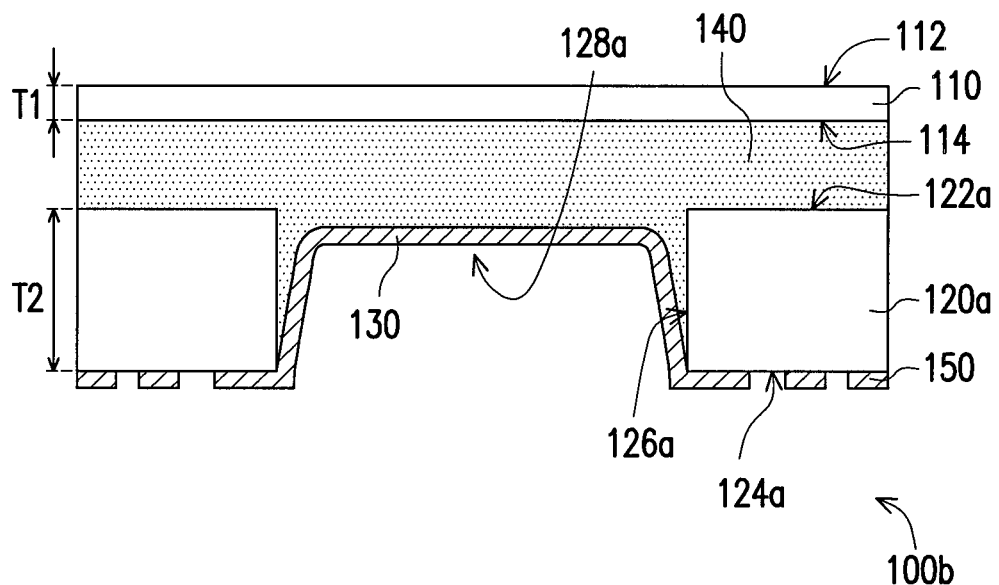

Finally, referring to FIG. 2E, a portion of the metal layer 130 formed on the fourth surface 124a of the second insulating layer 120a is patterned to form a patterned circuit layer 150 exposing a portion of the fourth surface 124a of the second insulating layer 120a. Up to this point, the method of manufacturing the cover structure 100b is completed.

In terms of structure, referring to FIG. 2E, the cover structure 100b of the present embodiment includes the first insulating layer 110, the second insulating layer 120a, the metal layer 130, the adhesive layer 140, and the patterned circuit layer 150. The first insulating layer 110 has the first surface 112 and the second surface 114 opposite to each other. The second insulating layer 120a has the third surface 122a and the fourth surface 124a opposite to each other and the opening 126a passing through the third surface 122a and the fourth surface 124a. The third surface 122a of the second insulating layer 120a adheres to the second surface 114 of the first insulating layer 110 through the adhesive layer 140. Also, the cavity 128a is defined by the opening 126a of the second insulating layer 120a and the adhesive layer 140. The thickness T2 of the second insulating layer 120a is greater than the thickness T1 of the first insulating layer 110. The metal layer 130 is disposed on the cavity 128a and covers the inner wall of the cavity 128a. The patterned circuit layer 150 is disposed on the fourth surface 124a of the second insulating layer 120a and connects to the metal layer 130.

In addition, since the cover structure 100b of the present embodiment has the patterned circuit layer 150, the cover structure 100b can be electrically connected to an external circuit (e.g. the circuit board 10, referring to FIG. 1F) through the patterned circuit layer 150 to expand the application scope of the cover structure 100b. Furthermore, the cover structure 100b of the present embodiment includes the cavity 128a having the metal layer 130 disposed therein. When the cover structure 100b is positioned on the circuit board 10, the electronic devices 20, 22 (referring to FIG. 1F) on the circuit board 10 can be disposed in the cavity 128a. The metal layer 130 then acts as an electro-magnetic wave shielding layer to reduce EMI from the external environment and prevent the electronic devices 20, 22 on the circuit board 10 from being interfered by external signals. In short, the cover structure 100b has the function of preventing EMI and a wider application scope.

Figure 3A:
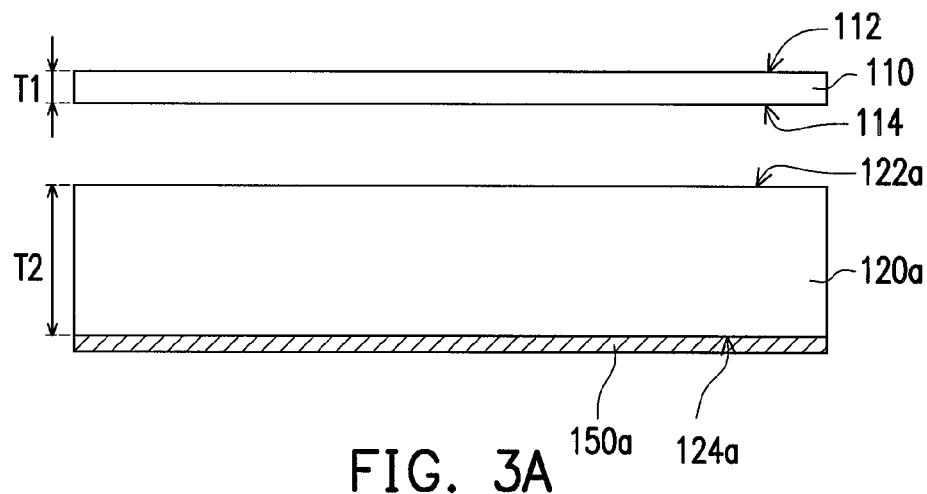
FIGS. 3A to 3E are schematic cross-sectional diagrams illustrating a method of manufacturing a cover structure according to another embodiment of the invention.
Figure 3B:
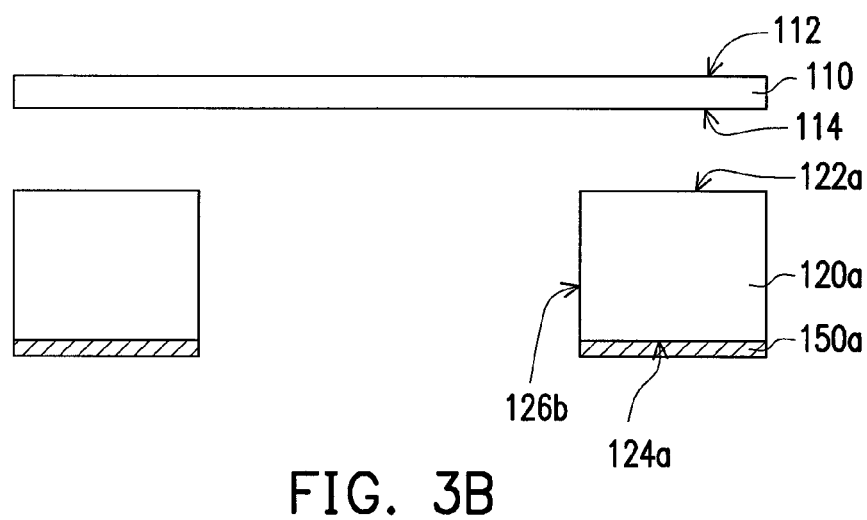
Figure 3C:
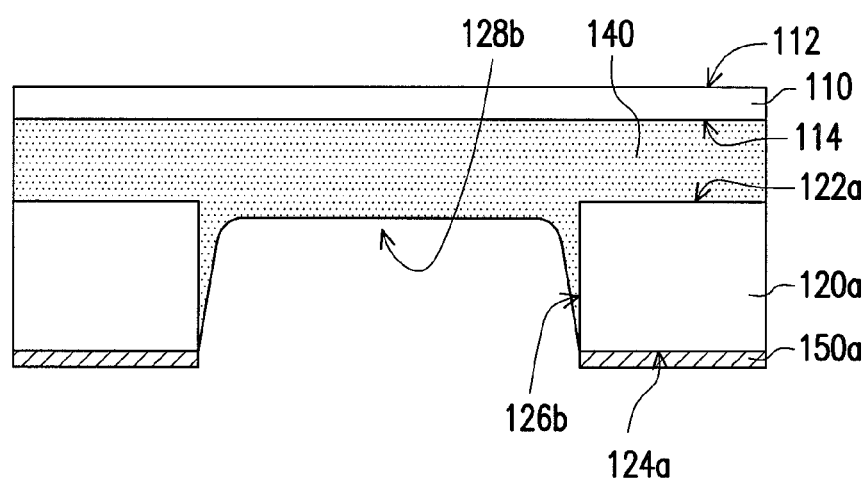
Figure 3D:
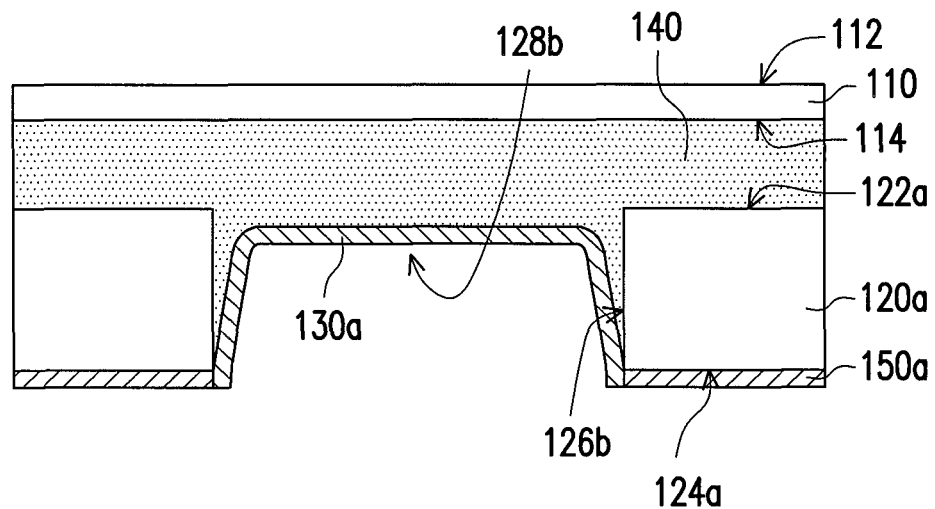
Figure 3E:
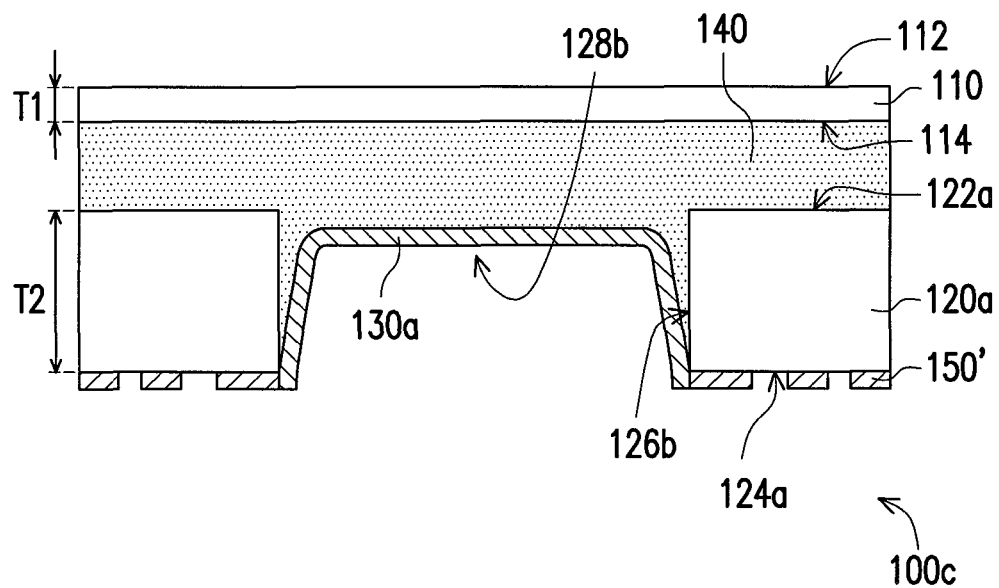

FIGS. 3A to 3E are schematic cross-sectional diagrams illustrating a method of manufacturing a cover structure according to another embodiment of the invention. Referring to FIG. 3E, the structure type of the cover structure 100c in the present embodiment is similar to that of the cover structure 100b in FIG. 2E; however, the two are different in manufacturing processes of a metal layer 130a and a patterned circuit layer 150'. In details, firstly, referring to FIG. 3A, a first insulating layer 110, a second insulating layer 120a, and a copper foil layer 150a are provided. The first insulating layer 110 has a first surface 112 and a second surface 114 opposite to each other. The second insulating layer 120a has a third surface 122a and a fourth surface 124a opposite to each other. The copper foil layer 150a is disposed on the fourth surface 124a of the second insulating layer 120a and covers the fourth surface 124a entirely. Particularly, in the present embodiment, a thickness T2 of the second insulating layer 120a is greater than a thickness T1 of the first insulating layer 110. A material of the first insulating layer 110 is substantially identical to that of the second insulating layer 120a, where the material is, for example, epoxy or BT resin.

Next, referring to FIG. 3B, an opening 126b passing through the copper foil layer 150a and the third surface 122a and the fourth surface 124a of the second insulating layer 120a is formed. A method of forming the opening 126b includes punching, routing, mechanical drilling, laser drilling, or other suitable methods.

Referring to FIG. 3C, an adhesive layer 140 is formed between the first insulating layer 110 and the second insulating layer 120a. The first insulating layer 110 and the second insulating layer 120a are laminated for the third surface 122a of the second insulating layer 120a to adhere to the second surface 114 of the first insulating layer 110 through the adhesive layer 140. That is, the first insulating layer 110 and the second insulating layer 120a are joined through the adhesive layer 140. Here, a cavity 128b is defined by the opening 126b and the adhesive layer 140 sandwiched between the first insulating layer 110 and the second insulating layer 120a. Since the first insulating layer 110 and the second insulating layer 120a are laminated through a thermal compression process in the present embodiment, a portion of the adhesive layer 140 then extends to an inner wall of the opening 126b as shown in FIG. 3C.

Referring to FIG. 3D, a metal layer 130a is formed on the cavity 128b. The metal layer 130a covers the inner wall of the cavity 128b and connects to the copper foil layer 150a. In the present embodiment, a method of forming the metal layer 130a includes an electroplating process.

Finally, referring to FIG. 3E, the copper foil layer 150a is patterned to form a patterned circuit layer 150' exposing a portion of the fourth surface 124a of the second insulating layer 120a. Up to this point, the method of manufacturing the cover structure 100c is completed.

FIGS. 4A to 4E are schematic cross-sectional diagrams illustrating a method of manufacturing a cover structure according to another embodiment of the invention. Firstly, referring to FIG. 4A, a first insulating layer 110, a second insulating layer 120a, a first copper foil layer 152a, a second copper foil layer 154a, a third copper foil layer 156a, and a fourth copper foil layer 158a are provided. The first insulating layer 110 has a first surface 112 and a second surface 114 opposite to each other. The first copper foil layer 152a and the second copper foil layer 154a are disposed respectively on the first surface 112 and the second surface 114 of the first insulating layer 110 entirely. The second insulating layer 120a has a third surface 122a and a fourth surface 124a opposite to each other. The third copper foil layer 156a and the fourth copper foil layer 158a are disposed respectively on the third surface 122a and the fourth surface 124a of the second insulating layer 120a entirely. More particularly, in the present embodiment, a thickness T2 of the second insulating layer 120a is greater than a thickness T1 of the first insulating layer 110. A material of the first insulating layer 110 is substantially identical to that of the second insulating layer 120a.

Figure 4A:
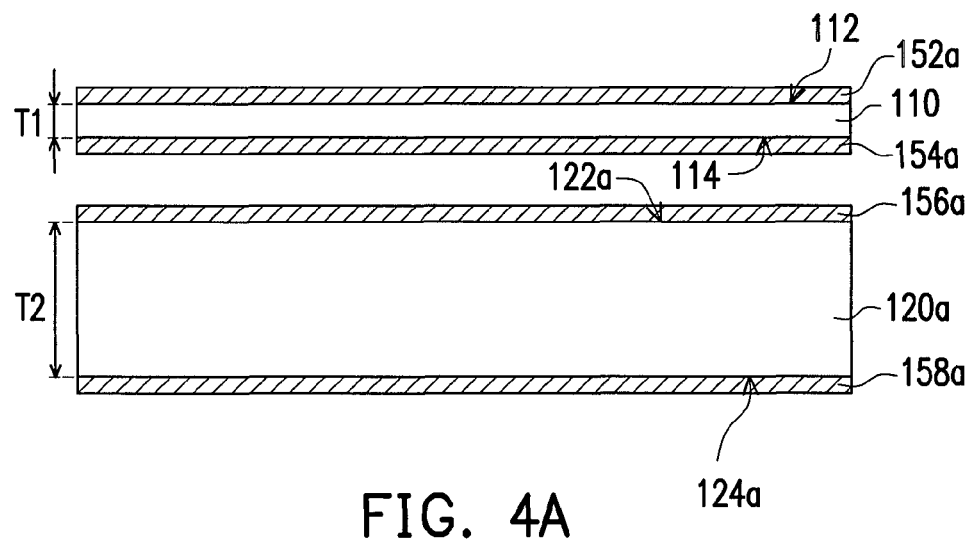
FIGS. 4A to 4E are schematic cross-sectional diagrams illustrating a method of manufacturing a cover structure according to another embodiment of the invention.
Figure 4B:
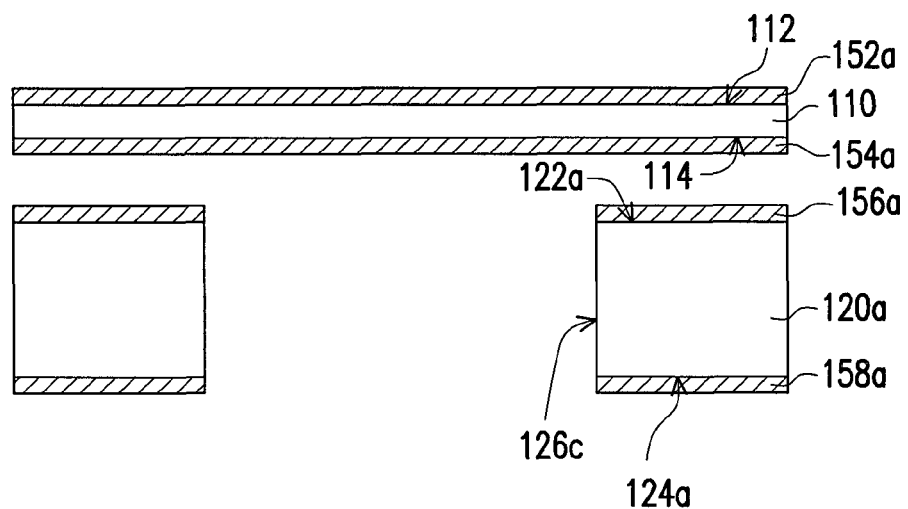

Next, referring to FIG. 4B, an opening 126c passing through the fourth copper foil layer 158a, the third surface 122a and the fourth surface 124a of the second insulating layer 120a, and the third copper foil layer 156a is formed. A method of forming the opening 126c includes punching, routing, mechanical drilling, laser drilling, or other suitable methods.

Figure 4C:
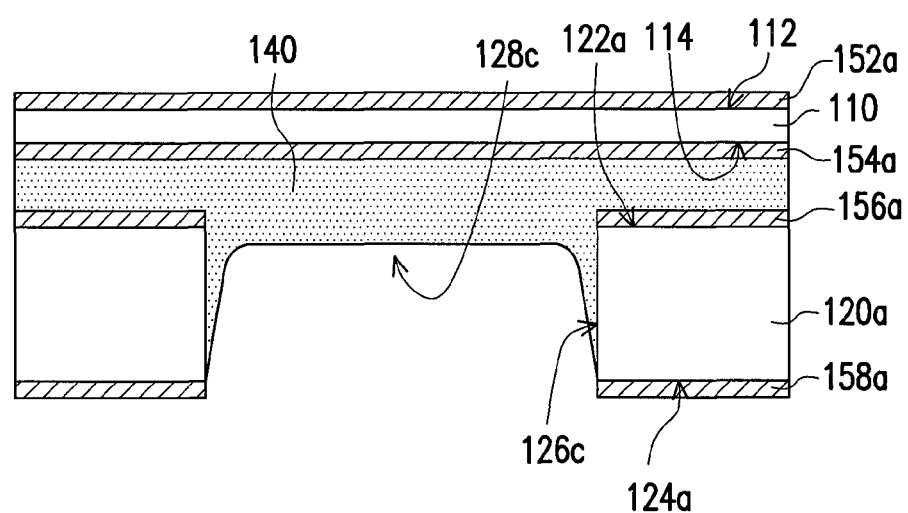

Referring to FIG. 4C, an adhesive layer 140 is formed between the first insulating layer 110 and the second insulating layer 120a. The first insulating layer 110 and the second insulating layer 120a are laminated so that the third copper foil layer 156a adheres to the second copper foil layer 154a through the adhesive layer 140. At this time, a cavity 128c is defined by the opening 126c and the adhesive layer 140. Since the first insulating layer 110 and the second insulating layer 120a are laminated through a thermal compression process in the present embodiment, a portion of the adhesive layer 140 then extends to an inner wall of the opening 126c as shown in FIG. 4C.

Figure 4D:
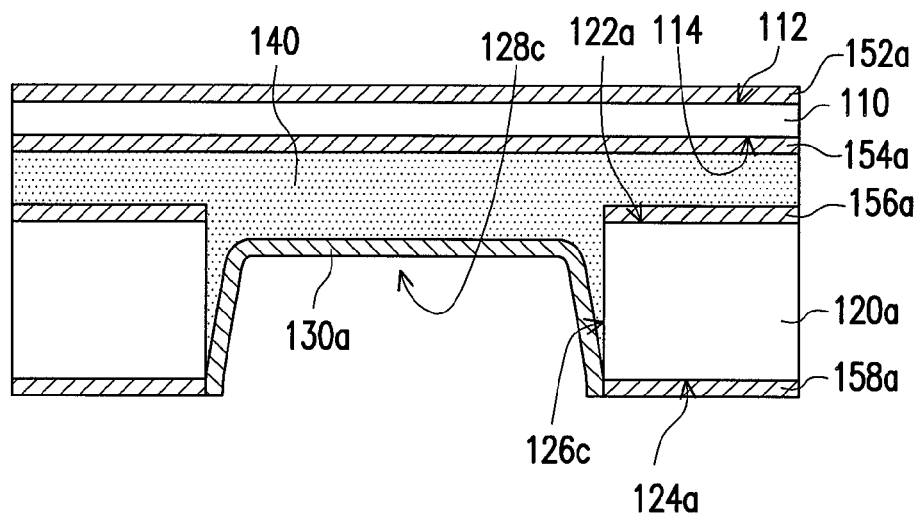

Referring to FIG. 4D, a metal layer 130a is formed on the cavity 128c. The metal layer 130a covers the inner wall of the cavity 128c and connects to the fourth copper foil layer 158a. In the present embodiment, a method of forming the metal layer 130a includes an electroplating process.

Figure 4E:
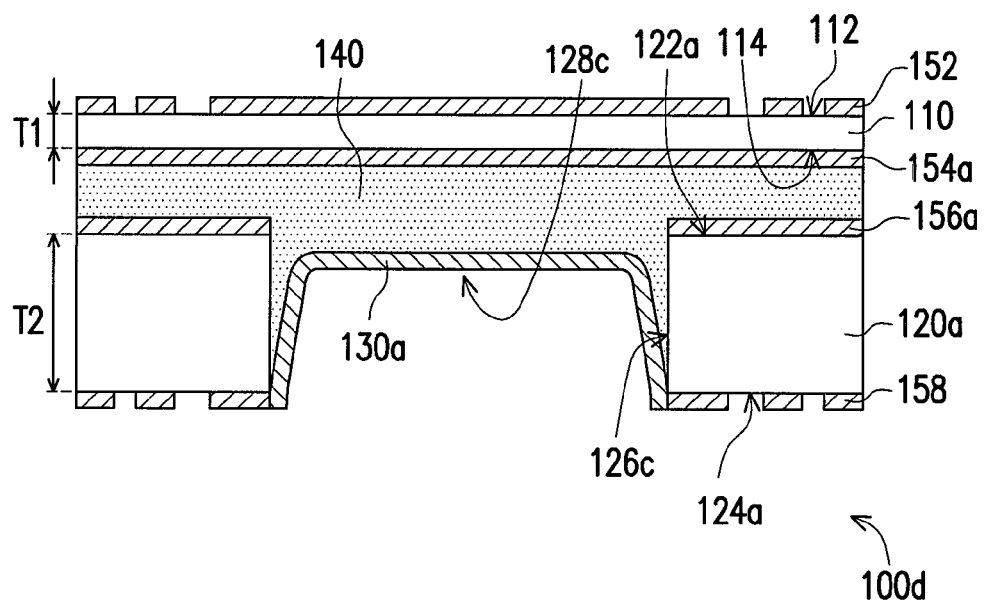

Lastly, referring to FIG. 4E, the first copper foil layer 152a and the fourth copper foil layer 158a are patterned to form a first patterned circuit layer 152 exposing a portion of the first surface 112 of the first insulating layer 110 and a fourth patterned circuit layer 158 exposing a portion of the fourth surface 124a of the second insulating layer 120a. Up to this point, the method of manufacturing the cover structure 100d is completed.

In terms of structure, referring to FIG. 4E, the cover structure 100d of the present embodiment includes the first insulating layer 110, the second insulating layer 120a, the metal layer 130a, the adhesive layer 140, the first patterned circuit layer 152, the second copper foil layer 154a, the third copper foil layer 156a, and the fourth patterned circuit layer 158. The first insulating layer 110 has the first surface 112 and the second surface 114 opposite to each other. The first patterned circuit layer 152 and the second copper foil layer 154a are disposed on the first surface 112 and the second surface 114 respectively. The second insulating layer 120a has the third surface 122a and the fourth surface 124a opposite to each other and the opening 126c passing through the third surface 122a and the fourth surface 124a. The third copper foil layer 156a and the fourth patterned circuit layer 158 are disposed on the third surface 122a and the fourth surface 124a respectively. The third copper foil layer 156a adheres to the second copper foil layer 154a through the adhesive layer 140. The cavity 128c is defined by the opening 126c and the adhesive layer 140. The thickness T2 of the second insulating layer 120a is greater than the thickness T1 of the first insulating layer 110. The metal layer 130a is disposed on the cavity 128c and covers the inner wall of the cavity 128c. The metal layer 130a connects to the fourth patterned circuit layer 158.

Since the cover structure 100d of the present embodiment has a first patterned circuit layer 152 and the fourth patterned circuit layer 158, the cover structure 100d can be electrically connected to an external circuit (not shown) through the first patterned circuit layer 152 and be electrically connected to another external circuit (e.g. the circuit board 10, referring to FIG. 1F) through the fourth patterned circuit layer 158 to widen the application scope of the cover structure 100d. Furthermore, the cover structure 100d of the present embodiment includes the cavity 128c having the metal layer 130a disposed therein. When the cover structure 100d is positioned on the circuit board 10, the electronic devices 20, 22 (referring to FIG. 1F) on the circuit board 10 can be disposed in the cavity 128c. The metal layer 130a then acts as an electro-magnetic wave shielding layer to reduce EMI from the external environment and prevent the electronic devices 20, 22 on the circuit board 10 from being interfered by external signals.

Figure 5A:
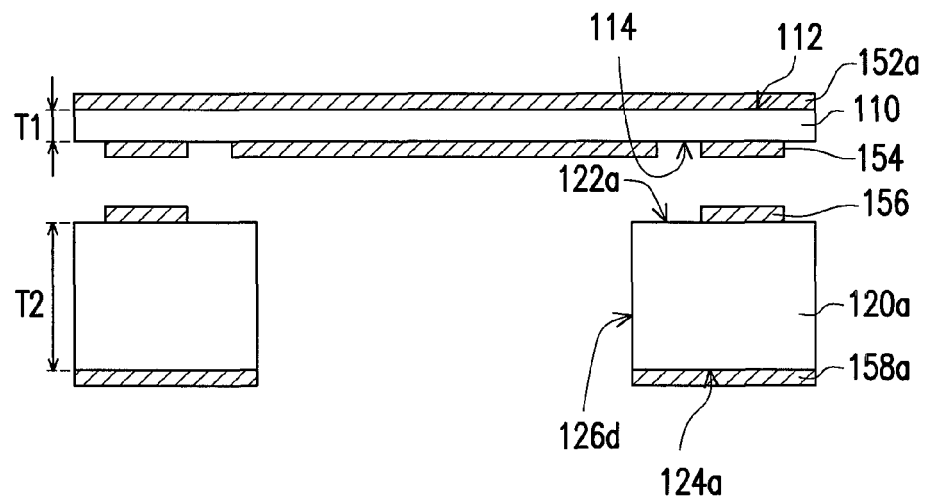
FIGS. 5A to 5D are schematic cross-sectional diagrams illustrating several steps in a method of manufacturing a cover structure according to an embodiment of the invention.
Figure 5B:
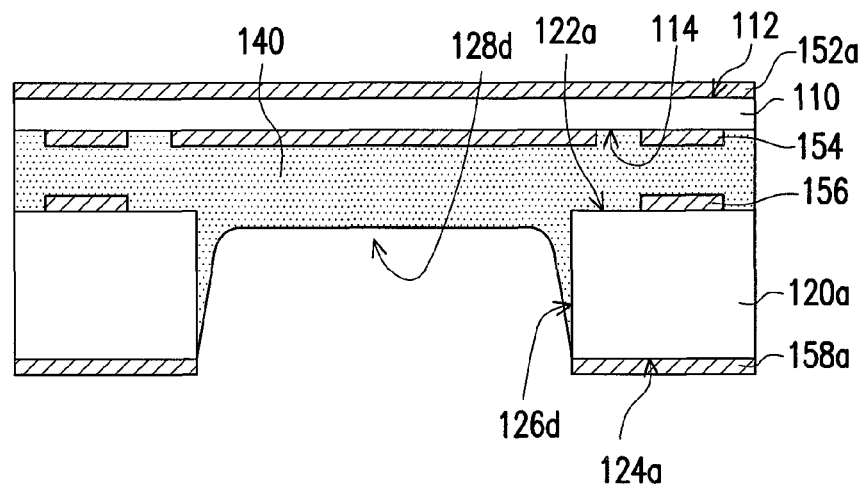
Figure 5C:
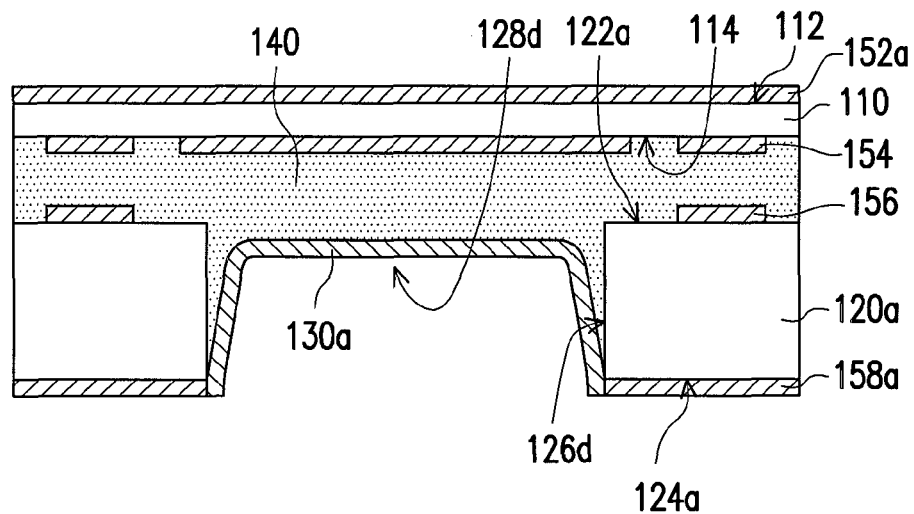
Figure 5D:
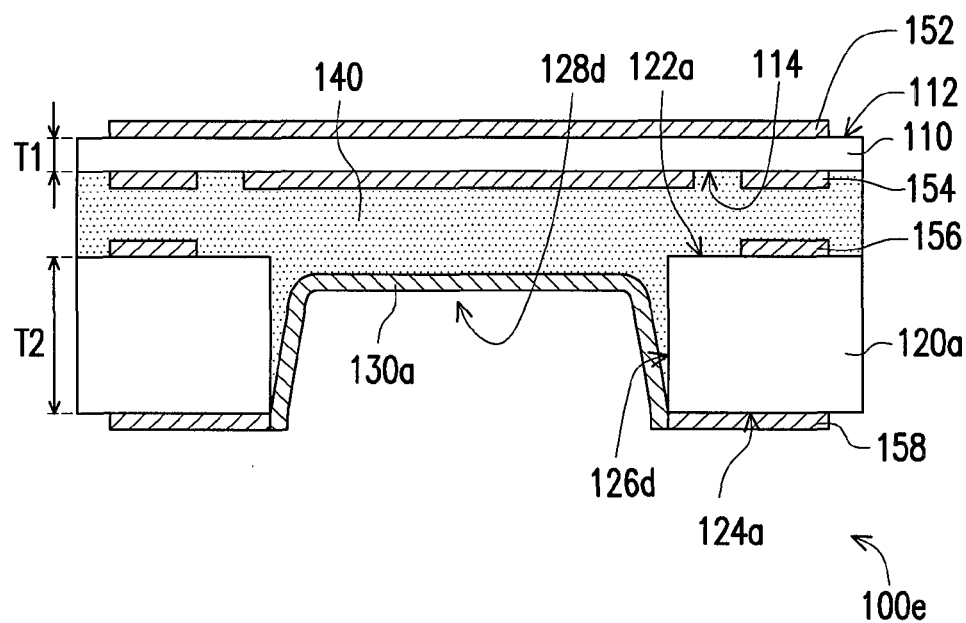

FIGS. 5A to 5D are schematic cross-sectional diagrams illustrating several steps in a method of manufacturing a cover structure according to another embodiment of the invention. Referring to FIG. 5D, the cover structure 100e is similar to the cover structure 100d in FIG. 4E. However, the two are different in the patterning of the second copper foil layer 154a and the third copper foil layer 156a in the cover structure 100e.

In details, the cover structure 100e of the present embodiment can be manufactured using the similar method for manufacturing the cover structure 100d of the above embodiment. After the step in FIG. 4A is performed, referring to FIG. 5A, the second copper foil layer 154a and the third copper foil layer 156a are patterned to form a second patterned circuit layer 154 exposing a portion of the second surface 114 of the first insulating layer 110 and a third patterned circuit layer 156 exposing a portion of the third surface 122a of the second insulating layer 120a. Next, an opening 126d passing through the fourth copper foil layer 158a and the third surface 122a and the fourth surface 124a of the second insulating layer 120a is formed. Referring to FIG. 5B, an adhesive layer 140 is formed between the first insulating layer 110 and the second insulating layer 120a. The first insulating layer 110 and the second insulating layer 120a are laminated so that the third patterned circuit layer 156 adheres to the second patterned circuit layer 154 through the adhesive layer 140. At this time, a cavity 128d is defined by the opening 126d and the adhesive layer 140. Referring to FIG. 5C, a metal layer 130a is formed on the cavity 128d. The metal layer 130a covers the inner wall of the cavity 128d and connects to the fourth copper foil layer 158a. Lastly, referring to FIG. 5D, the first copper foil layer 152a and the fourth copper foil layer 158a are patterned to form a first patterned circuit layer 152 exposing a portion of the first surface 112 of the first insulating layer 110 and a fourth patterned circuit layer 158 exposing a portion of the fourth surface 124a of the second insulating layer 120a. Up to this point, the method of manufacturing a cover structure 100e is completed.

In terms of structure, referring to FIG. 5D, the cover structure 100e of the present embodiment includes the first insulating layer 110, the second insulating layer 120a, the metal layer 130a, the adhesive layer 140, the first patterned circuit layer 152, the second patterned circuit layer 154, the third patterned circuit layer 156, and the fourth patterned circuit layer 158. The first insulating layer 110 has the first surface 112 and the second surface 114 opposite to each other. The first patterned circuit layer 152 and the second patterned circuit layer 154 are disposed on the first surface 112 and the second surface 114 respectively. The second insulating layer 120a has the third surface 122a and the fourth surface 124a opposite to each other and the opening 126d passing through the third surface 122a and the fourth surface 124a. The third patterned circuit layer 156 and the fourth patterned circuit layer 158 are disposed on the third surface 122a and the fourth surface 124a respectively. The third patterned circuit layer 156 adheres to the second patterned circuit layer 154 through the adhesive layer 140. The cavity 128d is defined by the opening 126d and the adhesive layer 140. The metal layer 130a is disposed on the cavity 128d and covers the inner wall of the cavity 128d. The metal layer 130a connects to the fourth patterned circuit layer 158.

Since the cover structure 100e of the present embodiment has a first patterned circuit layer 152 and the fourth patterned circuit layer 158, the cover structure 100e can be electrically connected to an external circuit (not shown) through the first patterned circuit layer 152 and be electrically connected to another external circuit (e.g. the circuit board 10, referring to FIG. 1F) through the fourth patterned circuit layer 158 to widen the application scope of the cover structure 100e. Furthermore, the disposition of the second patterned circuit layer 154 and the third patterned circuit layer 156 of the cover structure 100e can be redistributed. In other words, the second patterned circuit layer 154 and the third patterned circuit layer 156 are deemed as redistribution layers (RDLs) to expand the application scope of the cover structure 100e. Furthermore, the cover structure 100e of the present embodiment includes the cavity 128d having the metal layer 130a disposed therein. When the cover structure 100e is positioned on the circuit board 10, the electronic devices 20, 22 (referring to FIG. 1F) on the circuit board 10 can be disposed in the cavity 128d. The metal layer 130a then acts as an electro-magnetic wave shielding layer to reduce EMI from the external environment and prevent the electronic devices 20, 22 on the circuit board 10 from being interfered by external signals.

Figure 6A:
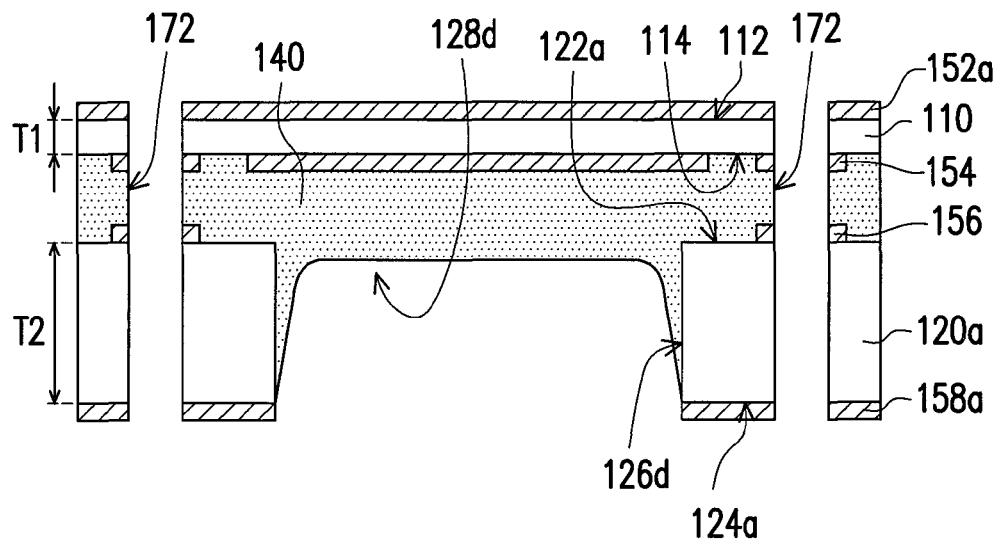
FIGS. 6A to 6C are schematic cross-sectional diagrams illustrating several steps in a method of manufacturing a cover structure according to another embodiment of the invention.
Figure 6B:
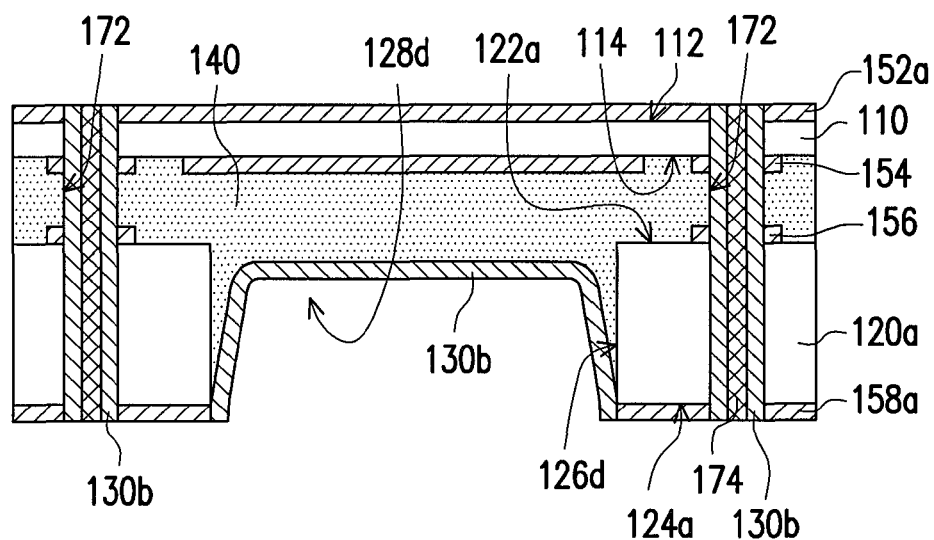
Figure 6C:
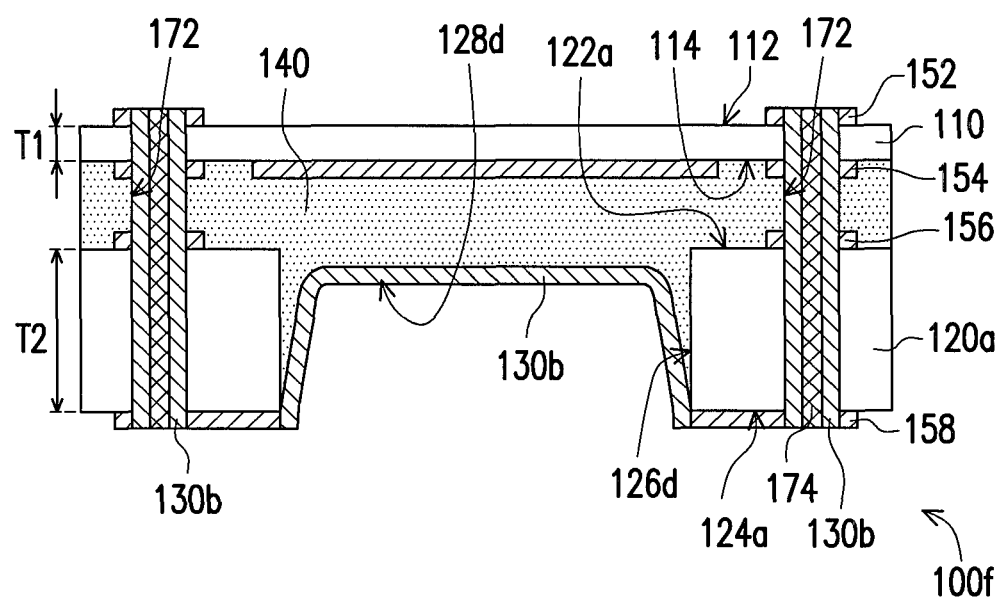

FIGS. 6A to 6C are schematic cross-sectional diagrams illustrating several steps in a method of manufacturing a cover structure according to another embodiment of the invention. Referring to FIG. 6C, the cover structure 100f is similar to the cover structure 100e in FIG. 5D. Nonetheless, the main difference between the two is that the cover structure 100f further includes at least one conductive via structure.

In details, the cover structure 100f in the present embodiment can be manufactured using the method for manufacturing the cover structure 100e in the above embodiment. After the step in FIG. 5B is carried out, referring to FIG. 6A, at least one via 172 (two vias are illustrated in FIG. 6A) passing through the first copper foil layer 152a, the first insulating layer 110, the second patterned circuit layer 154, the adhesive layer 140, the third patterned circuit layer 156, the second insulating layer 120a, and the fourth copper foil layer 158a is formed. Next, referring to FIG. 6B, a metal layer 130b is formed on a plurality of inner walls of the cavity 128d and the vias 172, and a conductive material 174 is filled in the vias 172. Here, the metal layer 130b and the conductive material 174 in the vias 172 constitute a conductive via structure. Thereafter, referring to FIG. 6C, the first copper foil layer 152a and the fourth copper foil layer 158a are patterned to form a first patterned circuit layer 152 exposing a portion of the first surface 112 of the first insulating layer 110 and a fourth patterned circuit layer 158 exposing a portion of the fourth surface 124a of the second insulating layer 120a. Herein, two ends of the conductive via structure connect to the first patterned circuit layer 152 and the fourth patterned circuit layer 158 respectively. Up to this point, the method of manufacturing the cover structure 100f is completed.

In terms of structure, referring to FIG. 6C, the cover structure 100f of the present embodiment includes the first insulating layer 110, the second insulating layer 120a, the metal layer 130b, the adhesive layer 140, the first patterned circuit layer 152, the second patterned circuit layer 154, the third patterned circuit layer 156, the fourth patterned circuit layer 158, and the conductive via structure. The first insulating layer 110 has the first surface 112 and the second surface 114 opposite to each other. The first patterned circuit layer 152 and the second patterned circuit layer 154 are disposed on the first surface 112 and the second surface 114 respectively. The second insulating layer 120a has the third surface 122a and the fourth surface 124a opposite to each other and the opening 126d passing through the third surface 122a and the fourth surface 124a. The third patterned circuit layer 156 and the fourth patterned circuit layer 158 are disposed on the third surface 122a and the fourth surface 124a respectively. The third patterned circuit layer 156 adheres to the second patterned circuit layer 154 through the adhesive layer 140. The cavity 128d is defined by the opening 126d and the adhesive layer 140. The metal layer 130b is disposed on the cavity 128d and covers the inner wall of the cavity 128d. The metal layer 130b connects to the fourth patterned circuit layer 158. In addition, the conductive via structure of the present embodiment is constituted by the metal layer 130b and the conductive material 174 in the vias 172. The conductive via structure passes through the first patterned circuit layer 152, the first insulating layer 110, the second patterned circuit layer 154, the adhesive layer 140, the third patterned circuit layer 156, the second insulating layer 120a, and the fourth patterned circuit layer 158. The two ends of the conductive via structure connect to the first patterned circuit layer 152 and the fourth patterned circuit layer 158 respectively.

Since the cover structure 100f of the present embodiment has a first patterned circuit layer 152 and the fourth patterned circuit layer 158, the cover structure 100f can be electrically connected to an external circuit (not shown) through the first patterned circuit layer 152 and be electrically connected to another external circuit (e.g. the circuit board 10, referring to FIG. 1F) through the fourth patterned circuit layer 158 to widen the application scope of the cover structure 100f. The disposition of the second patterned circuit layer 154 and the third patterned circuit layer 156 in the cover structure 100f can be redistributed and further connect to the first patterned circuit layer 152 and the fourth patterned circuit layer 158 through the conductive via structure to expand the application scope of the cover structure 100f. The cover structure 100f of the present embodiment includes the cavity 128d having the metal layer 130b disposed therein. When the cover structure 100f is positioned on the circuit board 10, the electronic devices 20, 22 (referring to FIG. 1F) on the circuit board 10 can be disposed in the cavity 128d. The metal layer 130b then acts as an electro-magnetic wave shielding layer to reduce EMI from the external environment and prevent the electronic devices 20, 22 on the circuit board 10 from being interfered by external signals.

Figure 7A:
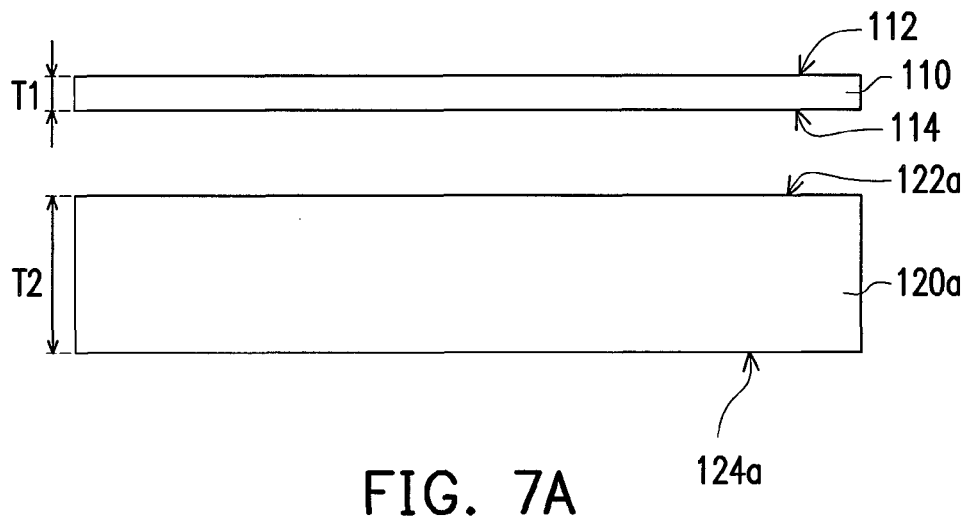
FIGS. 7A to 7F are schematic cross-sectional diagrams illustrating a method of manufacturing a cover structure according to another embodiment of the invention.

FIGS. 7A to 7E are schematic cross-sectional diagrams illustrating a method of manufacturing a cover structure according to another embodiment of the invention. Referring to FIG. 7A, a first insulating layer 110 and a second insulating layer 120a are provided. The first insulating layer 110 has a first surface 112 and a second surface 114 opposite to each other. The second insulating layer 120a has a third surface 122a and a fourth surface 124a opposite to each other. Particularly, in the present embodiment, a thickness T2 of the second insulating layer 120a is greater than a thickness T1 of the first insulating layer 110. A material of the first insulating layer 110 is substantially identical to that of the second insulating layer 120a, where the material is, for example, BT resin.

Figure 7B:
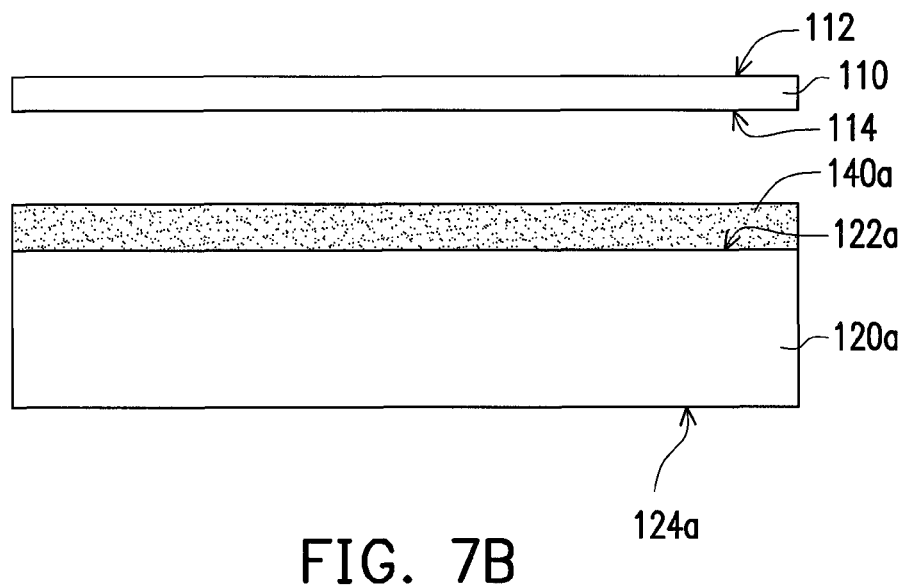

Referring to FIG. 7B, an adhesive layer 140a is provided on the third surface 122a of the second insulating layer 120a. A material of the adhesive layer 140a includes epoxy resin, BT resin, polyimide resin, or a polymer material, for example.

Figure 7C:
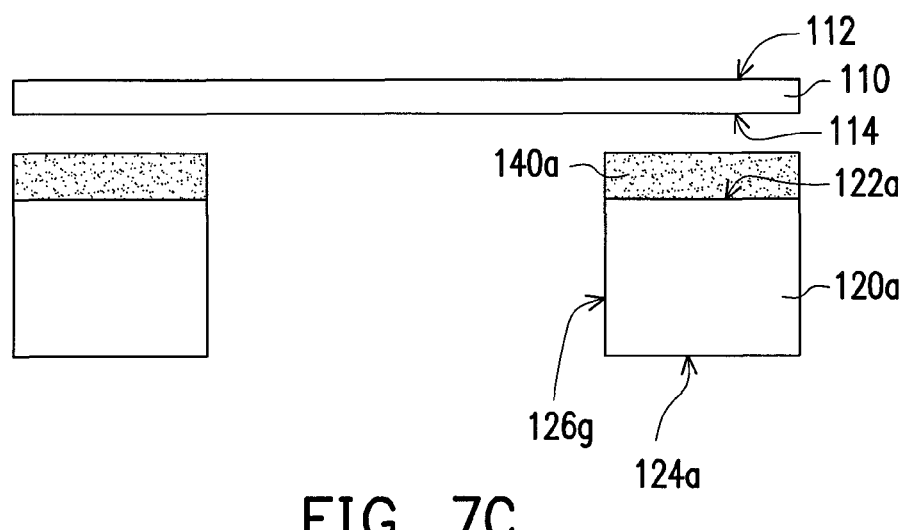

Next, referring to FIG. 7C, an opening 126g passing through the third surface 122a and the fourth surface 124a of the second insulating layer 120a is formed. A method of forming the opening 126g includes punching, routing, mechanical drilling, laser drilling, or other suitable methods.

Figure 7D:
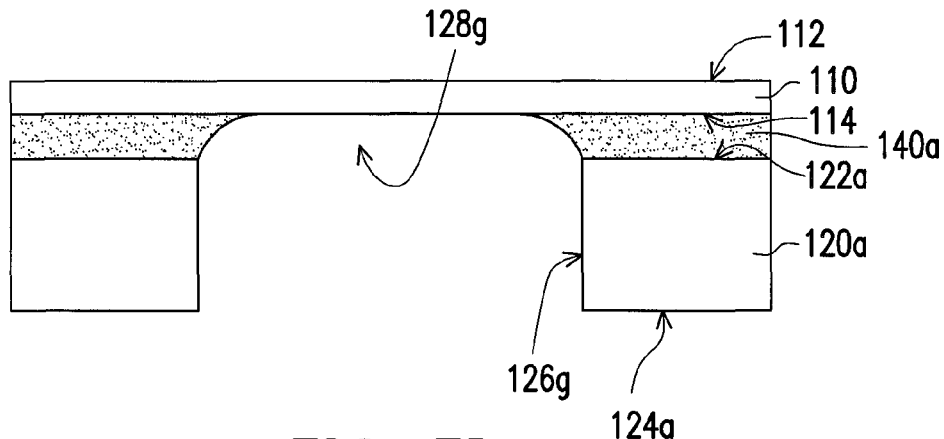

Later, referring to FIG. 7D, the first insulating layer 110, the adhesive layer 140a and the second insulating layer 120a are laminated so that the third surface 122a of the second insulating layer 120a adheres to the second surface 114 of the first insulating layer 110 through the adhesive layer 140a. In other words, the first insulating layer 110 and the second insulating layer 120a are joined through the adhesive layer 140a. The opening 126g, the adhesive layer 140a, and the first insulating layer 110 then define a cavity 128g.

Figure 7E:
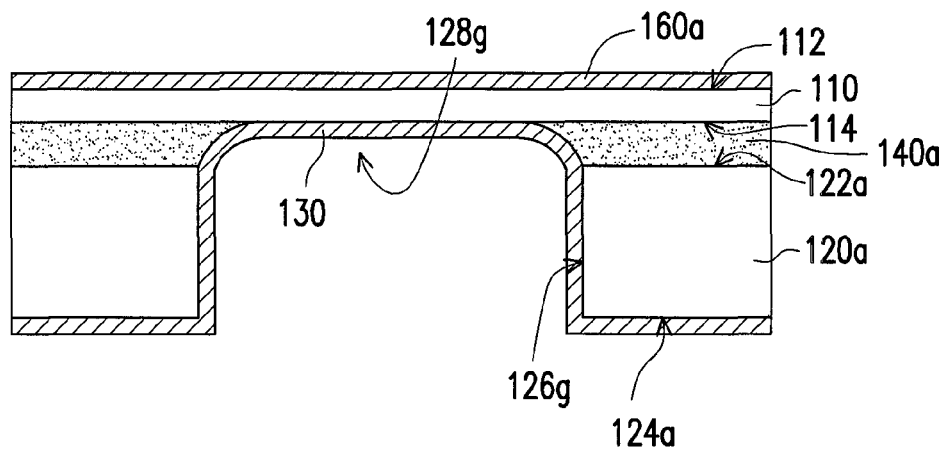

Referring to FIG. 7E, a metal layer 130 is formed on the fourth surface 124a of the second insulating layer 120a and the cavity 128g, and a first copper layer 160a is formed on the first surface 112 of the first insulating layer 110. Here, the metal layer 130 covers an inner wall of the fourth surface 124a of the second insulating layer 120a and an inner wall of the cavity 128g. The first copper layer 160a covers the first surface 112 of the first insulating layer 110. In the present embodiment, a method of forming the metal layer 130 and the first copper layer 160a includes an electroplating process.

Figure 7F:
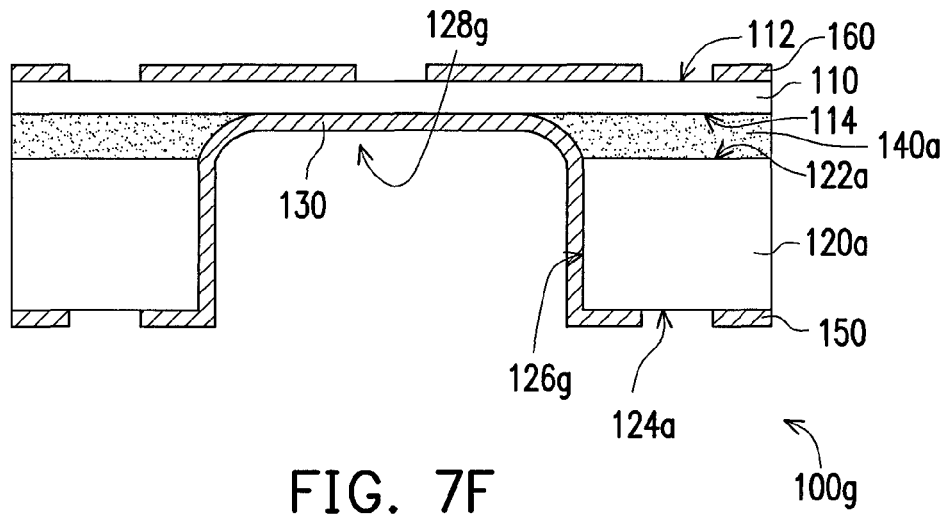

Finally, referring to FIG. 7F, a portion of the metal layer 130 formed on the fourth surface 124a of the second insulating layer 120a is patterned to form a patterned circuit layer 150 exposing a portion of the fourth surface 124a of the second insulating layer 120a. The first copper layer 160 is patterned to form a patterned copper layer 160 exposing the first surface 112 of the first insulating layer 110. Up to this point, the method of manufacturing the cover structure 100g is completed.

FIGS. 8A to 8F are schematic cross-sectional diagrams illustrating a method of manufacturing a cover structure according to another embodiment of the invention. Firstly, referring to FIG. 8A, a first insulating layer 110, a second insulating layer 120a, a first copper foil layer 152a, a second copper foil layer 154a, a third copper foil layer 156a, and a fourth copper foil layer 158a are provided. The first insulating layer 110 has a first surface 112 and a second surface 114 opposite to each other. The first copper foil layer 152a and the second copper foil layer 154a are disposed respectively on the first surface 112 and the second surface 114 of the first insulating layer 110 entirely. The second insulating layer 120a has a third surface 122a and a fourth surface 124a opposite to each other. The third copper foil layer 156a and the fourth copper foil layer 158a are disposed respectively on the third surface 122a and the fourth surface 124a of the second insulating layer 120a entirely. More particularly, in the present embodiment, a thickness T2 of the second insulating layer 120a is greater than a thickness T1 of the first insulating layer 110. A material of the first insulating layer 110 is substantially identical to that of the second insulating layer 120a.

Figure 8A:
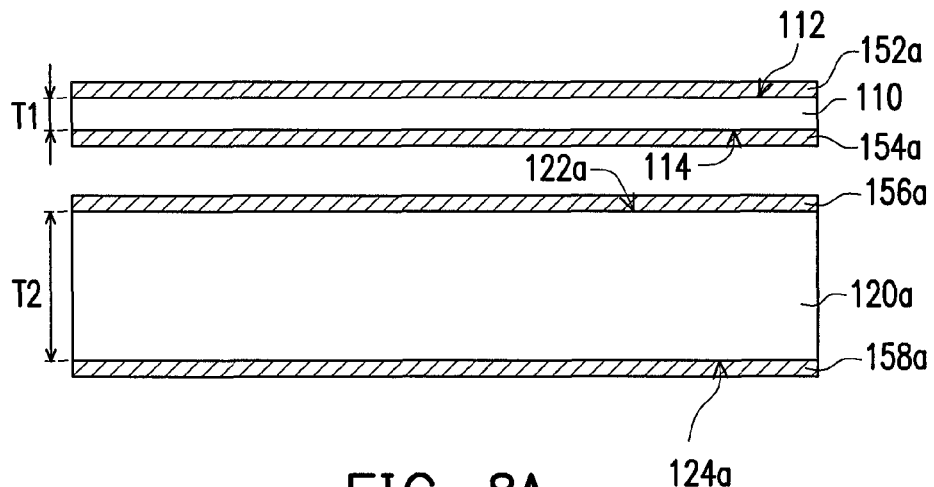
FIGS. 8A to 8F are schematic cross-sectional diagrams illustrating a method of manufacturing a cover structure according to another embodiment of the invention.
Figure 8B:
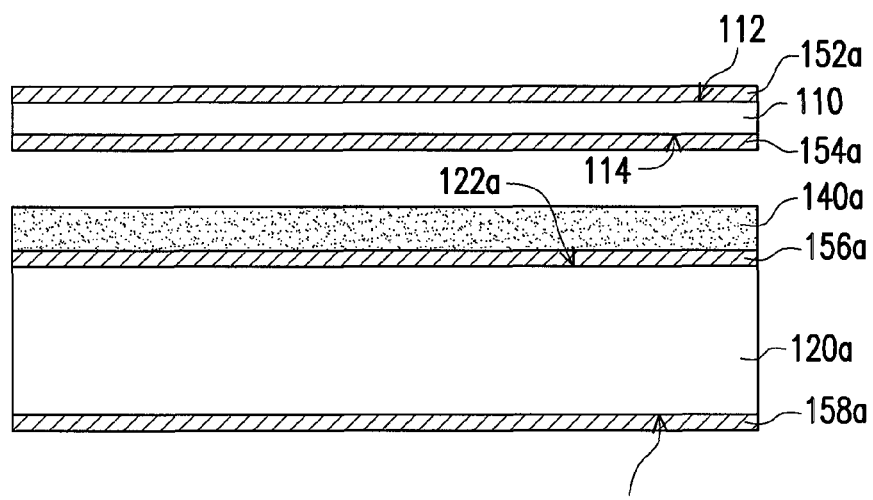

Referring to FIG. 8B, an adhesive layer 140a is provided on the third copper foil layer 156a. A material of the adhesive layer 140a includes epoxy resin, BT resin, polyimide resin, or a polymer material, for example.

Figure 8C:
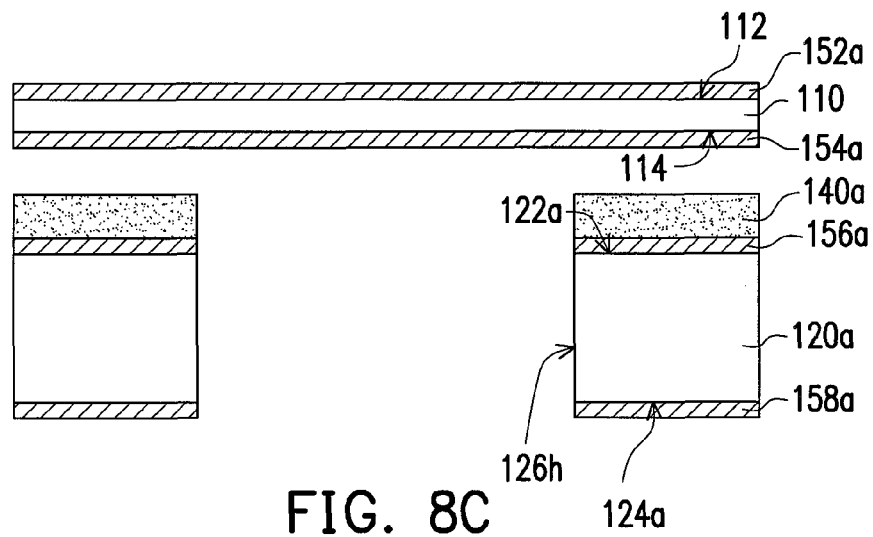

Next, referring to FIG. 8C, an opening 126h passing through the fourth copper foil layer 158a, the third surface 122a and the fourth surface 124a of the second insulating layer 120a, the third copper foil layer 156a, and the adhesive layer 140a is formed. A method of forming the opening 126h includes punching, routing, mechanical drilling, laser drilling, or other suitable methods.

Figure 8D:
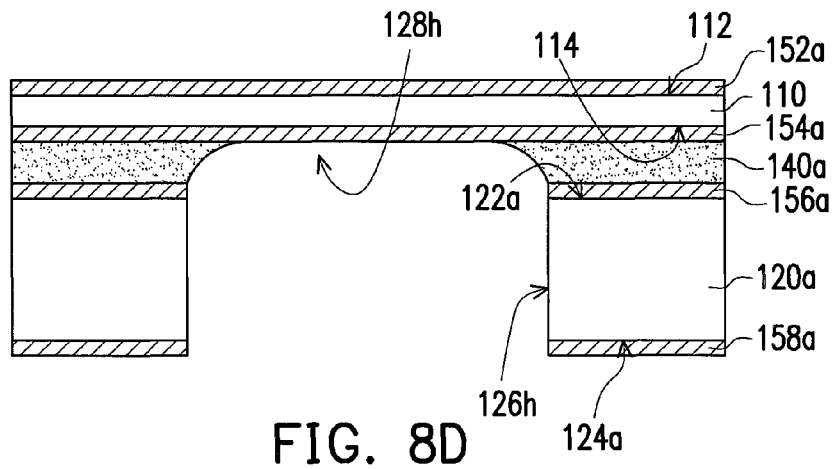

Referring to FIG. 8D, the first insulating layer 110, the adhesive layer 140a, and the second insulating layer 120a are laminated so that the third copper foil layer 156a adheres to the second copper foil layer 154a through the adhesive layer 140a. At this time, a cavity 128h is defined by the opening 126h, the adhesive layer 140a, and the second copper foil layer 154a.

Figure 8E:
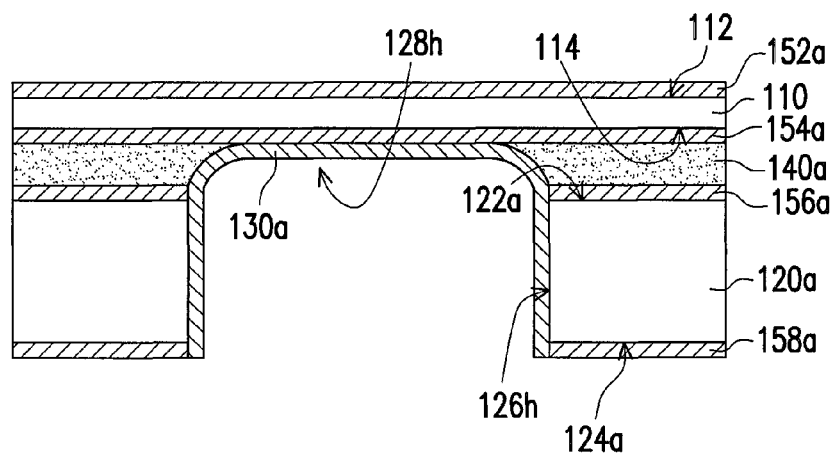

Referring to FIG. 8E, a metal layer 130a is formed on the cavity 128h. The metal layer 130a covers an inner wall of the cavity 128h and connects to the fourth copper foil layer 158a. In the present embodiment, a method of forming a metal layer 130a includes an electroplating process.

Figure 8F:
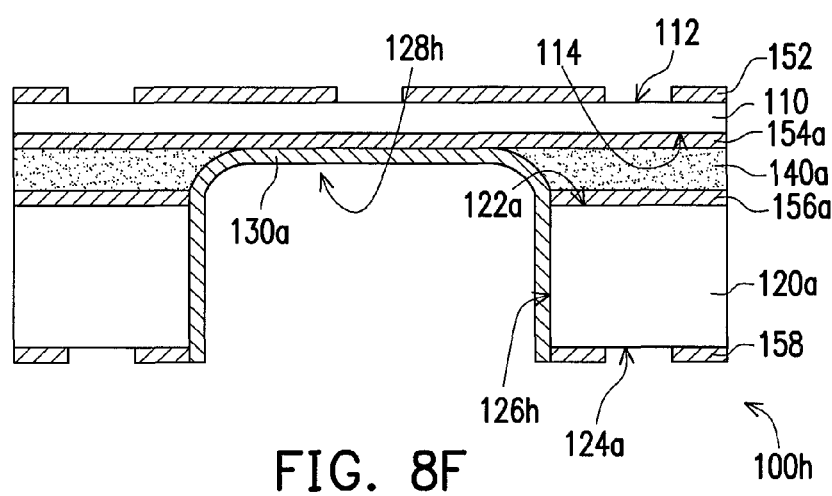

Lastly, referring to FIG. 8F, the first copper foil layer 152a and the fourth copper foil layer 158a are patterned to form a first patterned circuit layer 152 exposing a portion of the first surface 112 of the first insulating layer 110 and a fourth patterned circuit layer 158 exposing a portion of the fourth surface 124a of the second insulating layer 120a. Up to this point, the method of manufacturing the cover structure 100h is completed.

Figure 9A:
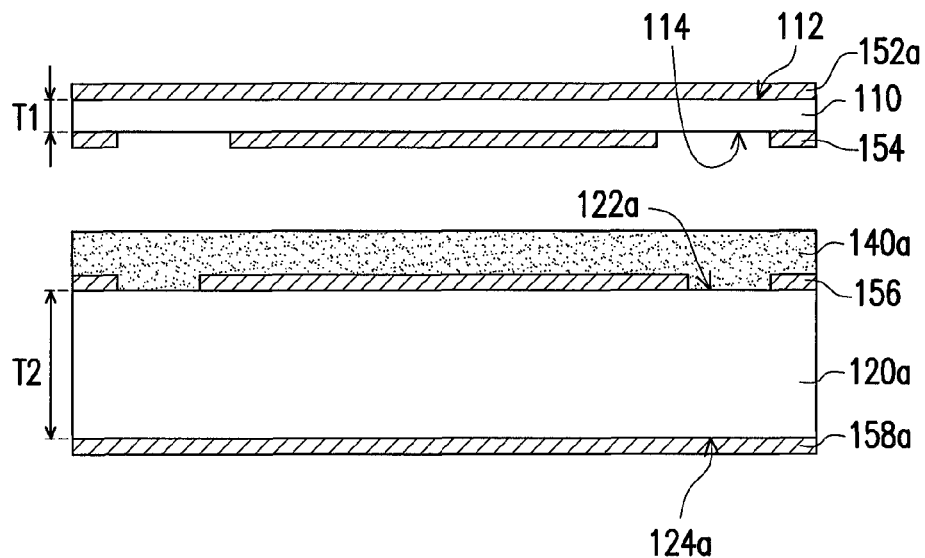
FIGS. 9A to 9C are schematic cross-sectional diagrams illustrating several steps in a method of manufacturing a cover structure according to another embodiment of the invention.
Figure 9B:
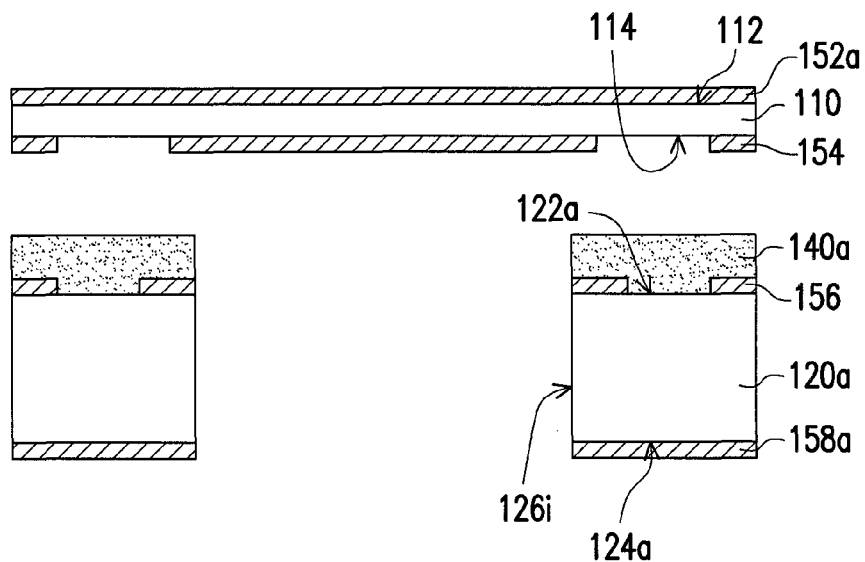
Figure 9C:
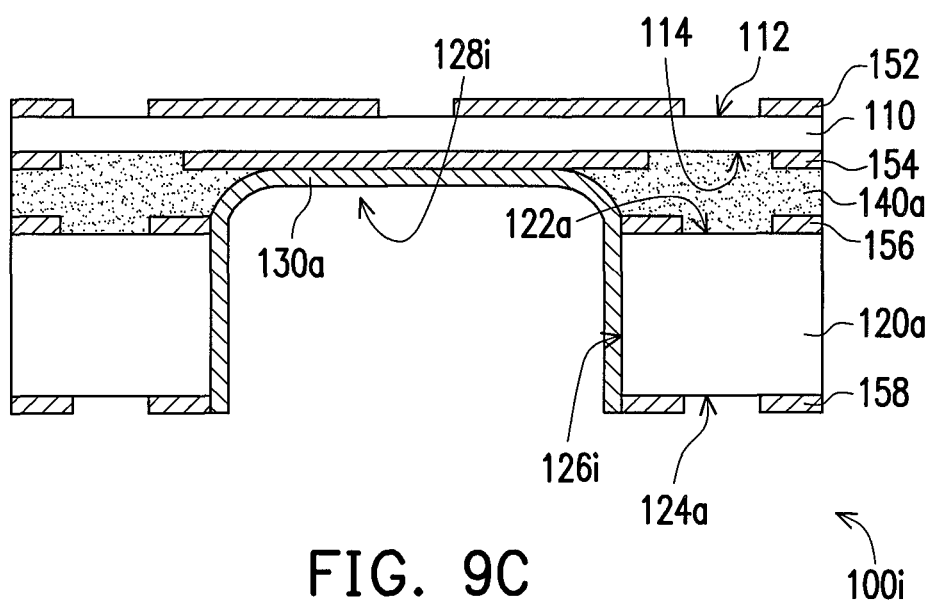

FIGS. 9A to 9C are schematic cross-sectional diagrams illustrating several steps in a method of manufacturing a cover structure according to another embodiment of the invention. Referring to FIG. 9C, the cover structure 100i is similar to the cover structure 100h in FIG. 8F. However, the two are different in the patterning of the second copper foil layer 154a and the third copper foil layer 156a in the cover structure 100i.

In details, the cover structure 100i of the present embodiment can be manufactured using the similar method for manufacturing the cover structure 100h of the above embodiment. After the step in FIG. 8A is performed, referring to FIG. 9A, the second copper foil layer 154a and the third copper foil layer 156a are patterned to form a second patterned circuit layer 154 exposing a portion of the second surface 114 of the first insulating layer 110 and a third patterned circuit layer 156 exposing a portion of the third surface 122a of the second insulating layer 120a. Next, referring to FIG. 9B, an opening 126i passing through the fourth copper foil layer 158a, the third surface 122a and the fourth surface 124a of the second insulating layer 120a, and the adhesive layer 140a is formed. Referring to FIG. 9C, the first insulating layer 110, the adhesive layer 140a, and the second insulating layer 120a are laminated so that the third patterned circuit layer 156 adheres to the second patterned circuit layer 154 through the adhesive layer 140a. At this time, a cavity 128i is defined by the opening 126i, the adhesive layer 140a, and the second patterned circuit layer 154. Afterwards, a metal layer 130a is formed on the cavity 128i. The metal layer 130a covers an inner wall of the cavity 128i and connects to the fourth copper foil layer 158a. Finally, the first copper foil layer 152a and the fourth copper foil layer 158a are patterned to form a first patterned circuit layer 152 exposing a portion of the first surface 112 of the first insulating layer 110 and a fourth patterned circuit layer 158 exposing a portion of the fourth surface 124a of the second insulating layer 120a. Up to this point, the method of manufacturing the cover structure 100i is completed.

Figure 10A:
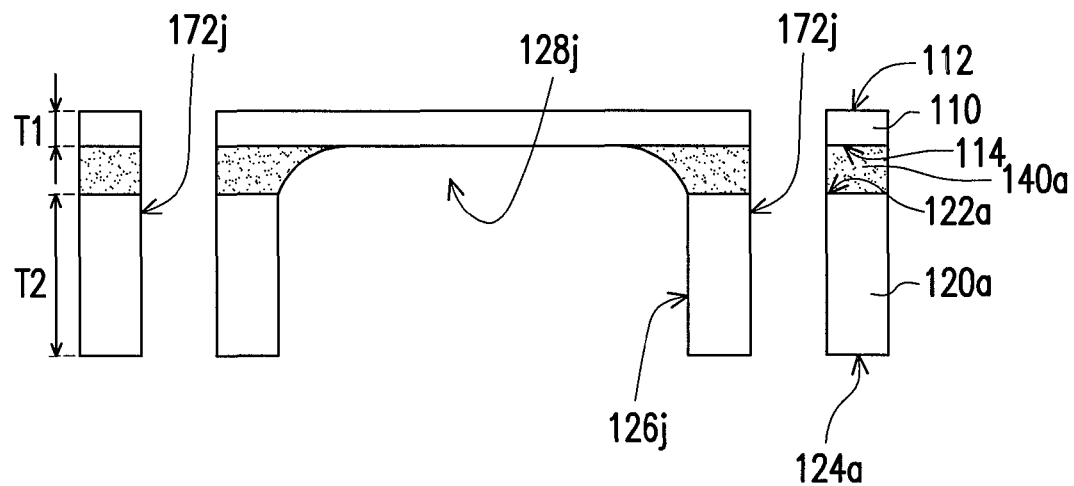
FIGS. 10A to 10C are schematic cross-sectional diagrams illustrating several steps in a method of manufacturing a cover structure according to another embodiment of the invention.
Figure 10B:
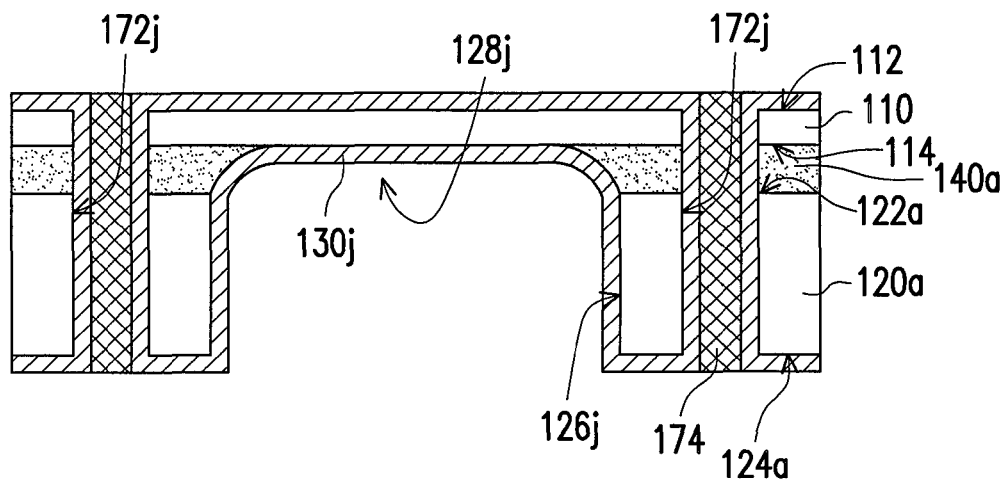
Figure 10C:
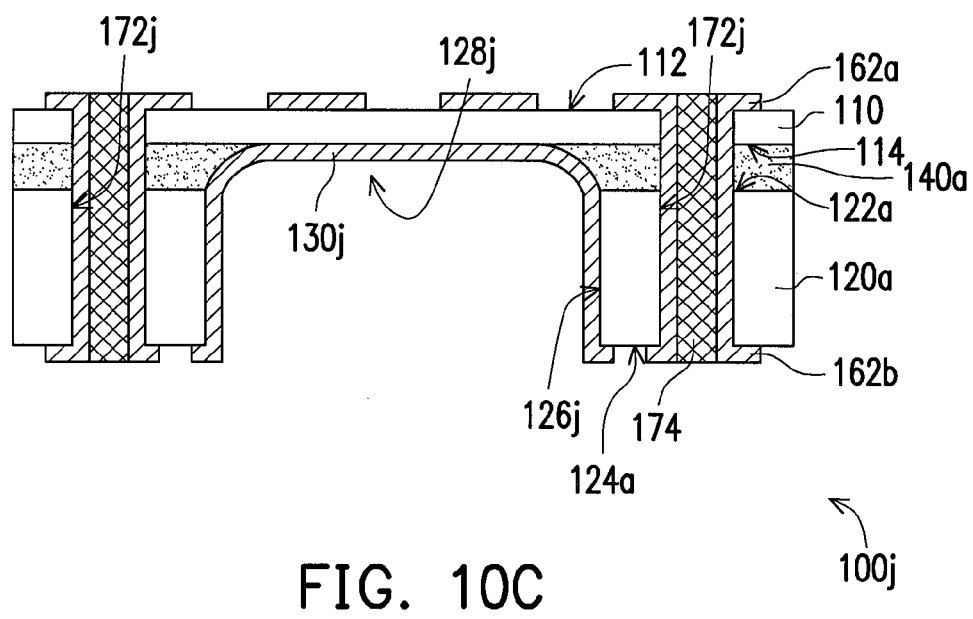

FIGS. 10A to 10C are schematic cross-sectional diagrams illustrating several steps in a method of manufacturing a cover structure according to another embodiment of the invention. Referring to FIG. 10C, the cover structure 100j is similar to the cover structure 100g in FIG. 7F. Nonetheless, the main difference between the two is that the cover structure 100j further includes at least one conductive via structure.

In details, the cover structure 100j of the present embodiment can be manufactured using the method for manufacturing the cover structure 100g in the above embodiment. After the step in FIG. 7D, referring to FIG. 10A, at least one via 172j (two vias are drawn in FIG. 10A) passing through the first insulating layer 110, the adhesive layer 140a, and the second insulating layer 120a is formed. Next, referring to FIG. 10B, a metal layer 130j is formed on the first surface 112 of the first insulating layer 110, the fourth surface 124a of the second insulating layer 120a, and a plurality of inner walls of the cavity 128j and the vias 172j. A conductive material 174 is filled in the vias 172j. Here, the metal layer 130b and the conductive material 174 in the vias 172j constitute a conductive via structure. The metal layer 130j is formed with an electroplating process, for instance. Thereafter, referring to FIG. 10C, the metal layer 130j on the first surface 112 of the first insulating layer 110 and the fourth surface 124a of the second insulating layer 120a is patterned to form a patterned copper layer 162a exposing a portion of the first surface 112 of the first insulating layer 110 and a patterned copper layer 162b exposing a portion of the fourth surface 124a of the second insulating layer 120a. Two ends of the conductive via structure connect to the patterned copper layer 162a and the patterned copper layer 162b respectively. Up to this point, the method of manufacturing the cover structure 100j is completed.

Figure 11A:
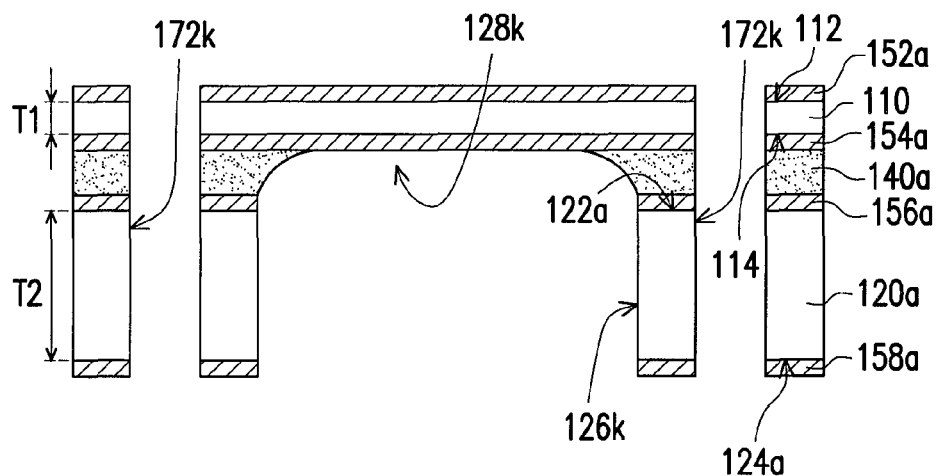
FIGS. 11A to 11C are schematic cross-sectional diagrams illustrating several steps in a method of manufacturing a cover structure according to another embodiment of the invention.
Figure 11B:
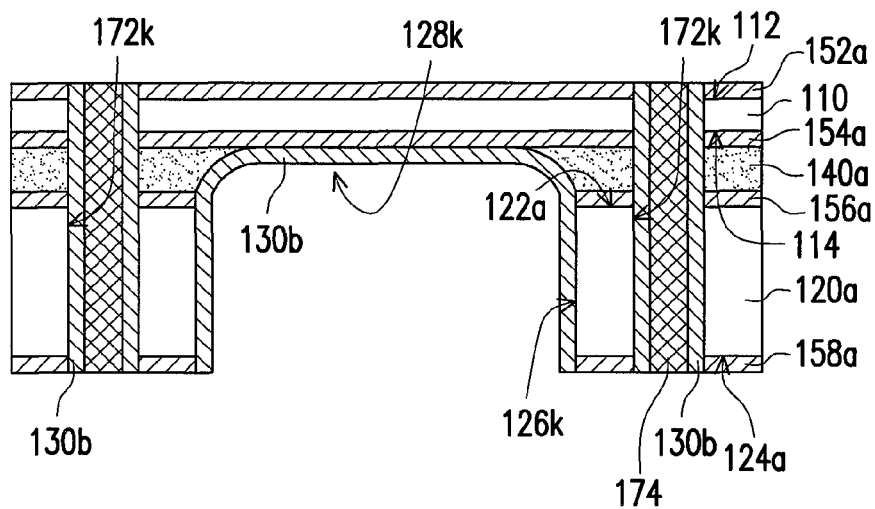
Figure 11C:
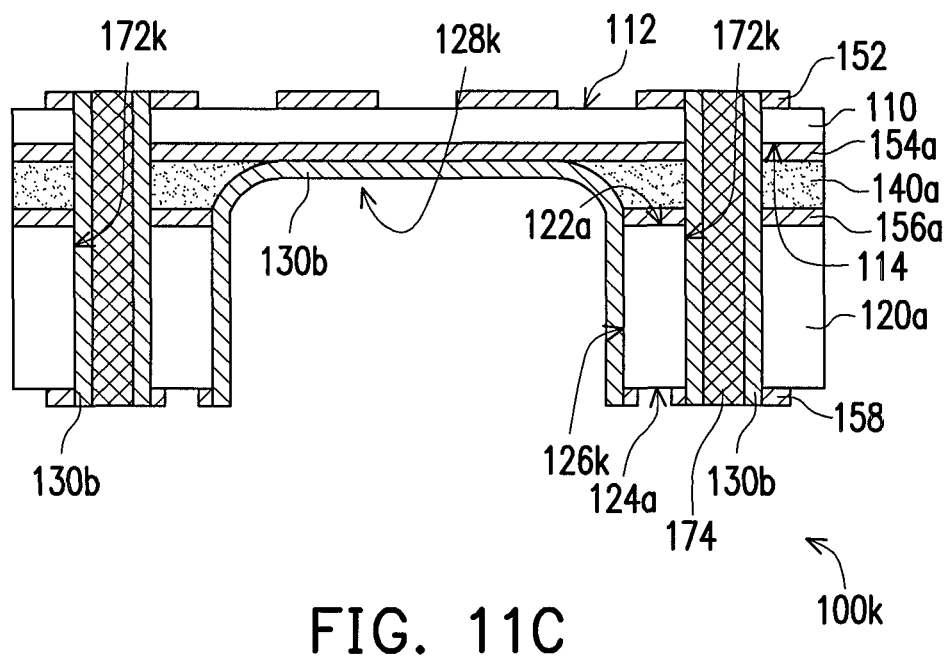

FIGS. 11A to 11C are schematic cross-sectional diagrams illustrating several steps in a method of manufacturing a cover structure according to another embodiment of the invention. Referring to FIG. 11C, the cover structure 100k is similar to the cover structure 100h in FIG. 8F. Nonetheless, the main difference between the two is that the cover structure 100k further includes at least one conductive via structure.

In details, the cover structure 100k of the present embodiment can be manufactured using the method for manufacturing the cover structure 100h in the above embodiment. After the step in FIG. 8D, referring to FIG. 11A, at least one via 172k (two vias are drawn in FIG. 11A) passing through the first copper foil layer 152a, the first insulating layer 110, the second copper foil layer 154a, the adhesive layer 140a, the third copper foil layer 156a, the second insulating layer 120a, and the fourth copper foil layer 158a is formed. Next, referring to FIG. 11B, a metal layer 130b is formed on a plurality of inner walls of the cavity 128k and the vias 172k, and a conductive material 174 is filled in the vias 172k. Here, the metal layer 130b and the conductive material 174 in the vias 172k constitute a conductive via structure. Thereafter, referring to FIG. 11C, the first copper foil layer 152a and the fourth copper foil layer 158a are patterned to form a first patterned circuit layer 152 exposing a portion of the first surface 112 of the first insulating layer 110 and a fourth patterned circuit layer 158 exposing a portion of the fourth surface 124a of the second insulating layer 120a. Herein, two ends of the conductive via structure connect to the first patterned circuit layer 152 and the fourth patterned circuit layer 158 respectively. Up to this point, the method of manufacturing the cover structure 100k is completed.

Figure 12A:
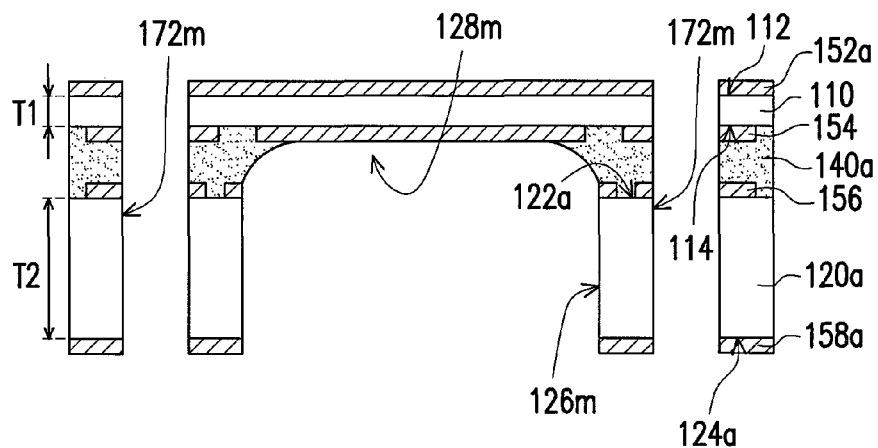
FIGS. 12A to 12C are schematic cross-sectional diagrams illustrating several steps in a method of manufacturing a cover structure according to another embodiment of the invention.
Figure 12B:
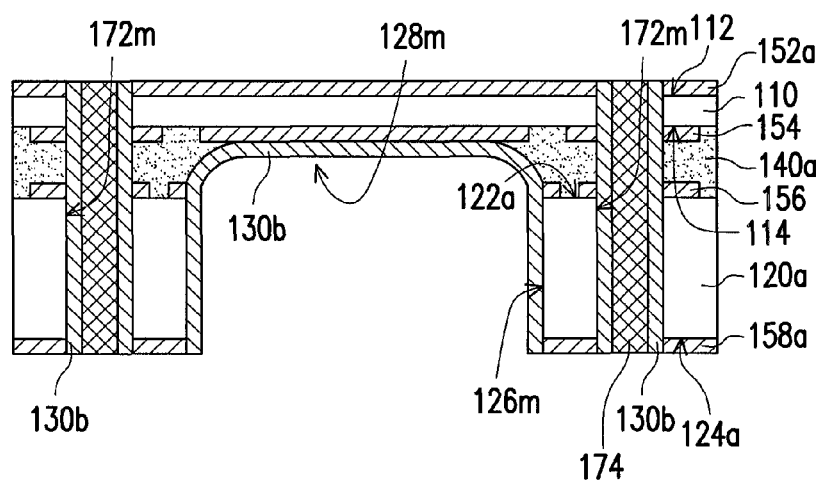
Figure 12C:
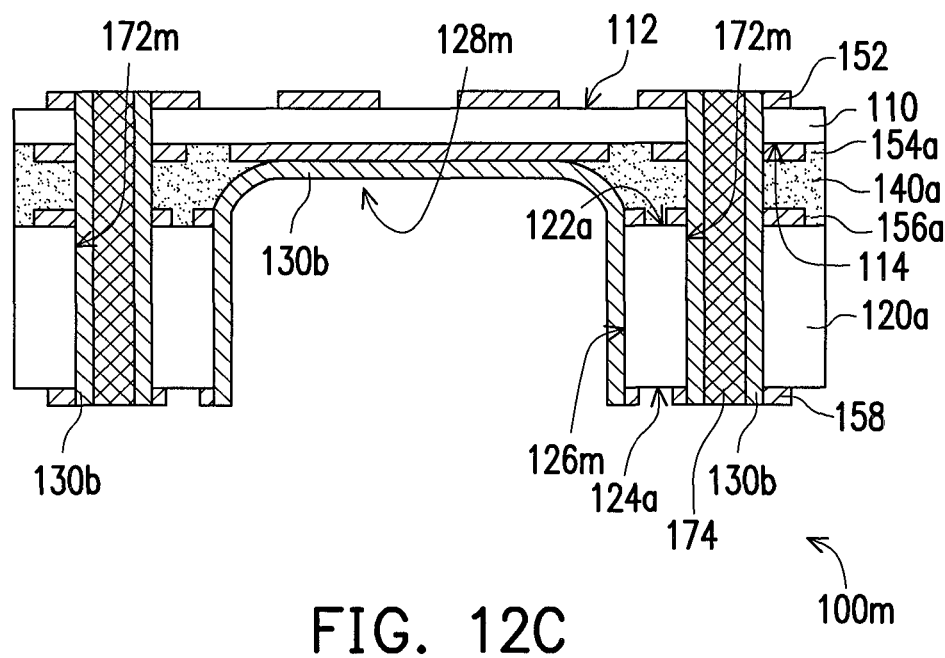

FIGS. 12A to 12C are schematic cross-sectional diagrams illustrating several steps in a method of manufacturing a cover structure according to another embodiment of the invention. Referring to FIG. 12C, the cover structure 100m is similar to the cover structure 100i in FIG. 9C. Nonetheless, the main difference between the two is that the cover structure 100m further includes at least one conductive via structure.

In details, the cover structure 100m in the present embodiment can be manufactured using the method for manufacturing the cover structure 100i in the above embodiment. After the first insulating layer 110, the adhesive layer 140a and the second insulating layer 120a are laminated, referring to FIG. 12A, at least one via 172m (two vias are illustrated in FIG. 12A) passing through the first copper foil layer 152a, the first insulating layer 110, the second patterned circuit layer 154, the adhesive layer 140a, the third patterned circuit layer 156, the second insulating layer 120a, and the fourth copper foil layer 158a is formed. Next, referring to FIG. 12B, a metal layer 130b is formed on a plurality of inner walls of the cavity 128m and the vias 172m, and a conductive material 174 is filled in the vias 172m. Herein, the metal layer 130b and the conductive material 174 in the vias 172m constitute a conductive via structure. Thereafter, referring to FIG. 12C, the first copper foil layer 152a and the fourth copper foil layer 158a are patterned to form a first patterned circuit layer 152 exposing a portion of the first surface 112 of the first insulating layer 110 and a fourth patterned circuit layer 158 exposing a portion of the fourth surface 124a of the second insulating layer 120a. Herein, two ends of the conductive via structure connect to the first patterned circuit layer 152 and the fourth patterned circuit layer 158 respectively. Up to this point, the method of manufacturing the cover structure 100m is completed.

In summary, the cover structure of the invention has a cavity and a metal layer is disposed on the cavity. When the cover structure is positioned on the circuit board, the electronic device on the circuit board can be disposed in the cavity. The metal layer then acts as an electro-magnetic wave shielding layer to reduce EMI from the external environment and prevent the electronic device on the circuit board from being interfered by external signals. Moreover, the cover structure of the invention can widen the application scope of circuits thereof with the distribution of the internal patterned circuit layers (that is, the second patterned circuit layer and the third patterned circuit layer) and the disposition of the conductive via structure. Since the exterior of the cover structure of the invention includes the disposition of patterned circuit layers (that is, the first patterned circuit layer and the fourth patterned circuit layer), the cover structure of the invention is not only capable of preventing EMI, but can also be electrically connected to an external circuit through the external patterned circuit layers to expand the application of the cover structure.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A cover structure suitable for covering a circuit board bearing at least one electronic device, the cover structure comprising:
   a first insulating layer having a first surface and a second surface opposite to each other;
   a second insulating layer having a third surface and a fourth surface opposite to each other and an opening passing through the third surface and the fourth surface, wherein the third surface of the second insulating layer connects to the second surface of the first insulating layer, a cavity is defined by the opening of the second insulating layer and the first insulating layer, and a thickness of the second insulating layer is greater than a thickness of the first insulating layer;
   a metal layer disposed on the cavity; and
   a patterned circuit layer disposed on the fourth surface of the second insulating layer and connecting to the metal layer, wherein the circuit board is electrically connected to the patterned circuit layer and the electronic device is sandwiched between the circuit board and the metal layer.

2. The cover structure as claimed in claim 1, wherein the second insulating layer is an adhesive film.

3. The cover structure as claimed in claim 1, further comprising an adhesive layer sandwiched between the first insulating layer and the second insulating layer.

4. The cover structure as claimed in claim 3, further comprising:
   a first patterned circuit layer disposed on the first surface of the first insulating layer and exposing a portion of the first surface;
   a second copper foil layer disposed on the second surface of the first insulating layer and covering the second surface entirely; and
   a third copper foil layer disposed on the third surface of the second insulating layer and covering the third surface entirely.

5. The cover structure as claimed in claim 3, further comprising:
   a first patterned circuit layer disposed on the first surface of the first insulating layer and exposing a portion of the first surface;
   a second patterned circuit layer disposed on the second surface of the first insulating layer and exposing a portion of the second surface; and
   a third patterned circuit layer disposed on the third surface of the second insulating layer and exposing a portion of the third surface.

6. The cover structure as claimed in claim 5, further comprising:
   at least one conductive hole structure passing through the first patterned circuit layer, the first insulating layer, the second patterned circuit layer, the adhesive layer, the third patterned circuit layer, the second insulating layer, and the fourth patterned circuit layer, wherein two ends of the conductive hole structure connect to the first patterned circuit layer and the fourth patterned circuit layer respectively.

\* \* \* \* \*